US009083383B1

(12) United States Patent
Tunali et al.

(10) Patent No.: US 9,083,383 B1
(45) Date of Patent: Jul. 14, 2015

(54) PARITY CHECK MATRIX

(71) Applicant: Xilinx, Inc., San Jose, CA (US)

(72) Inventors: Nihat E. Tunali, College Station, TX (US); Raghavendar M. Rao, Austin, TX (US); Raied N. Mazahreh, Sandy, UT (US); Krishna R. Narayanan, College Station, TX (US)

(73) Assignee: XILINX, INC., San Jose, CA (US)

( * ) Notice: Subject to any disclaimer, the term of this patent is extended or adjusted under 35 U.S.C. 154(b) by 157 days.

(21) Appl. No.: 13/752,689

(22) Filed: Jan. 29, 2013

(51) Int. Cl.
*H03M 13/00* (2006.01)
*H03M 13/13* (2006.01)

(52) U.S. Cl.
CPC ...................... *H03M 13/13* (2013.01)

(58) Field of Classification Search
CPC . H04L 1/0057; H04L 1/0041; H03M 13/116; H03M 13/1111; H03M 13/1137
USPC .......................................................... 714/752
See application file for complete search history.

(56) References Cited

U.S. PATENT DOCUMENTS

| 7,143,333 | B2 * | 11/2006 | Blankenship et al. ........ 714/781 |
| 8,112,695 | B2 * | 2/2012 | Costa et al. .................... 714/781 |
| 8,117,523 | B2 * | 2/2012 | Divsalar et al. ............... 714/801 |
| 2011/0004811 | A1 * | 1/2011 | Mourad et al. ................. 714/781 |
| 2011/0283162 | A1 * | 11/2011 | Murakami ..................... 714/758 |
| 2011/0307756 | A1 * | 12/2011 | Nguyen et al. ................. 714/752 |
| 2012/0166917 | A1 * | 6/2012 | El-Khamy et al. ............ 714/790 |

OTHER PUBLICATIONS

Junfeng Hu, Construction of Short Block length IRA Codes Based on Modified IPEG Algorithm, 2008, IEEE, p. 1-3.*
U.S. Appl. No. 13/287,943, filed Nov. 2, 2011, Dick et al.
U.S. Appl. No. 13/752,718, filed Jan. 29, 2013, Tunali et al.
Abbasfar, Aliazam et al., "Accumulate-Repair-Accumulate Codes," *IEEE Transactions on Communications*, Apr. 2007, pp. 692-702, vol. 55, No. 4, IEEE, Piscataway, New Jersey, USA.
Divsalar, Dariush. et al., "Low-rate LDPC codes with simple photogragh structure," *Proc. of the IEEE International Symposium on Information Theory*, Sep. 4, 2005, pp. 1622-1626, IEEE, Piscataway, New Jersey, USA.
Hu, Xiao-Yu et al., "Regular and Irregular Progressive Edge-Growth Tanner Graphs," *IEEE Transactions on Information Theory*, Jan. 2005, pp. 386-398, vol. 51, No. 1, IEEE, Piscataway, New Jersey, USA.

(Continued)

*Primary Examiner* — Albert Decady
*Assistant Examiner* — Enam Ahmed
(74) *Attorney, Agent, or Firm* — W. Eric Webostad

(57) ABSTRACT

An apparatus is disclosed. In this apparatus, at least one coder block has a parity check matrix. The parity check matrix comprises each element of an H matrix expanded by a Progressive Edge Growth ("PEG") expansion factor and an Approximate Cycle Extrinsic Message Degree ("ACE") expansion factor.

19 Claims, 105 Drawing Sheets

(56) References Cited

OTHER PUBLICATIONS

Lu, Ben et al., Performance Analysis and Design Optimization of LDPC-Coded MIMO OFDM Systems, *IEEE Transactions on Signal Processing*, Feb. 2004, pp. 348-361, vol. 52, No. 2, IEEE, Piscataway, New Jersey, USA.

Richardson, Thomas J. et al., "Design of Capacity-Approaching Irregular Low-Density Parity-Check Codes," *IEEE Transactions on Information Theory*, Feb. 2001, pp. 619-637, vol. 47, No. 2, IEEE, Piscataway, New Jersey, USA.

Tian, Tao et al., "Selective Avoidance of Cycles in Irregular LDPC Code Construction," *IEEE Transactions on Communications*, Aug. 2004, pp. 1242-1247, vol. 52, No. 8, IEEE, Piscataway, New Jersey, USA.

\* cited by examiner

```
for j=0 to n-1 do    ⌒ 601
begin   ⌒ 605 for k=0 to d_{s_j}-1 do   ⌒ 602
    begin  ⌒ 615 if k=0

$E_{s_j}^0$  ⟵  edge($c_i,s_j$)          ⎫ 603 else $E_{s_j}^k$  ⟵  edge($c_i,s_j$)          ⎬ 604 end ⌒ 616 end ⌒ 606
```

$$H_2 = \begin{bmatrix} 1&0&0&0&0 & \cdots & 0&0&0&0 \\ 1&1&0&0&0 & \cdots & 0&0&0&0 \\ 0&1&1&0&0 & \cdots & 0&0&0&0 \\ 0&0&1&1&0 & \cdots & 0&0&0&0 \\ \bullet&\bullet&\bullet&\bullet&\bullet & \bullet & \bullet&\bullet&\bullet&\bullet \\ \bullet&\bullet&\bullet&\bullet&\bullet & \ddots & \bullet&\bullet&\bullet&\bullet \\ \bullet&\bullet&\bullet&\bullet&\bullet & \bullet & \bullet&\bullet&\bullet&\bullet \\ 0&0&0&0&0 & \cdots & 1&1&0&0 \\ 0&0&0&0&0 & \cdots & 0&1&1&0 \\ 0&0&0&0&0 & \cdots & 0&0&1&1 \end{bmatrix}$$

FIG. 7 for (i=$m_{PEG}$ + 1; ≤ $5m_{PEG}$; i++) do ⌒ 901 begin ⌒ 915 redo ⌒ 902 expand each nonzero element in $H_{PEG}$ (:, i) with a ⌒ 903
random $m_{ACE}$ x $m_{ACE}$ shifted identity matrix for (j=(i-1)$m_{ACE}$ +1; j≤$m_{ACE}$ i; i++) do ⌒ 904 begin ⌒ 905

ACE detection for $s_j$; ⌒ 906 if ACE detection fails, go to redo ⌒ 907 end ⌒ 910
end ⌒ 916

FIG. 9

```
for (l=1; l≤d_ACE; l++) do                              ┌─ 1000
    begin
        for any active node w_s in level (l-1)
            begin
                Find its children set Ch(w_s);
                for every child μ_t ∈ Ch(w_s).
                    begin
                        p_temp ← p(w_s) + ACE (μ_t);
                        if (p_temp+p(μ_t)-ACE(s_j)-ACE(μ_t)) < n_ACE.
                            exit with failure;
                        elseif p_temp ≥ p(μ_t).
                            Deactivave μ_t in level l-1 with respect
                            to current parent w_s;
                        else
                            p(μ_t) ← p_temp;
                    end
            end
        end
    exit with success;
```

FIG. 10
(Prior Art)

| | ┌─1101 | | | | |
|---|---|---|---|---|---|
| 1 | 4188 ┘ | ┌─1102 | | | ↙1100 |
| 129 | 4099 | 4330 | | | |
| 257 | 4279 | 4362 | | | |
| 385 | 4360 | 4499 | | | |
| 513 | 4583 | 4636 | | | |
| 641 | 4710 | 4788 | | | |
| 769 | 4787 | 4936 | | | |
| 897 | 4956 | 5082 | | | |
| 1025 | 5086 | 5139 | | | |
| 1153 | 5154 | 5261 | | | |
| 1281 | 5270 | 5397 | | | |
| 1409 | 5441 | 5618 | | | |
| 1537 | 5571 | 5747 | | | |
| 1665 | 5716 | 5826 | | | |
| 1793 | 5782 | 5920 | | | |
| 1921 | 5951 | 6068 | | | |
| 2626 | 4120 | 4553 | 4897 | 5975 | 6235 |
| 2066 | 3998 | 4459 | 5326 | 6238 | 6329 |
| 2820 | 4696 | 5120 | 5649 | 6343 | 6405 |
| 2796 | 4491 | 5495 | 6134 | 6403 | 6586 |
| 2209 | 4286 | 5301 | 5786 | 6547 | 6749 |
| 2329 | 4721 | 5151 | 5902 | 6751 | 6841 |
| 2962 | 4389 | 4867 | 5519 | 6863 | 7038 |
| 3964 | 4129 | 5274 | 6052 | 7025 | 7126 |
| 3268 | 4769 | 5072 | 5857 | 7048 | 7192 |
| 3649 | 4376 | 5140 | 5757 | 7176 | 7299 |
| 2492 | 4641 | 5492 | 5802 | 7321 | 7509 |
| 3149 | 4233 | 5110 | 5571 | 7456 | 7553 |
| 3339 | 4801 | 5463 | 5902 | 7675 | 7720 |
| 4510 | 5239 | 5537 | 7706 | 7900 | |
| 3713 | 4319 | 4870 | 6144 | 7841 | 7941 |
| 3514 | 4223 | 4761 | 5757 | 7949 | 8120 |
| 2791 | 3635 | 4092 | 5917 | 8167 | 8223 |
| 2406 | 2958 | 3714 | 5850 | 8286 | 8434 |
| 2600 | 2840 | 3885 | 4373 | 8427 | 8475 |
| 2494 | 2764 | 3824 | 5693 | 8513 | 8703 |
| 2132 | 3108 | 3708 | 4852 | 8692 | 8717 |
| 2376 | 2847 | 3506 | 6062 | 8792 | 8849 |
| 2433 | 2984 | 3335 | 4300 | 8854 | 8968 |
| 2254 | 2937 | 3594 | 5395 | 8965 | 9132 |
| 2638 | 3058 | 3487 | 5117 | 9097 | 9330 |
| 2084 | 3281 | 3956 | 4513 | 9224 | 9464 |
| 2666 | 3183 | 3808 | 5366 | 9429 | 9588 |
| 2415 | 3267 | 3454 | 4925 | 9476 | 9659 |
| 2192 | 3166 | 3886 | 5218 | 9650 | 9729 |
| 2488 | 3243 | 3993 | 4107 | 9843 | 9963 |
| 2185 | 3420 | 3519 | 5582 | 9858 | 10021 |
| 2149 | 2700 | 4079 | 4628 | 10107 | 10128 |

FIG. 11

| | | | | | |
|---|---|---|---|---|---|
| (1,1) | (33,92) | | | | |
| (2,1) | (33,3) | (34,106) | | | |
| (3,1) | (34,55) | (35,10) | | | |
| (4,1) | (35,8) | (36,19) | | | |
| (5,1) | (36,103) | (37,28) | | | |
| (6,1) | (37,102) | (38,52) | | | |
| (7,1) | (38,51) | (39,72) | | | |
| (8,1) | (39,92) | (40,90) | | | |
| (9,1) | (40,94) | (41,19) | | | |
| (10,1) | (41,34) | (42,13) | | | |
| (11,1) | (42,22) | (43,21) | | | |
| (12,1) | (43,65) | (44,114) | | | |
| (13,1) | (44,67) | (45,115) | | | |
| (14,1) | (45,84) | (46,66) | | | |
| (15,1) | (46,22) | (47,32) | | | |
| (16,1) | (47,63) | (48,52) | | | |
| (21,66) | (33,24) | (36,73) | (39,33) | (47,87) | (49,91) |
| (17,18) | (32,30) | (35,107) | (42,78) | (49,94) | (50,57) |
| (23,4) | (37,88) | (40,128) | (45,17) | (50,71) | (51,5) |
| (22,108) | (36,11) | (43,119) | (48,118) | (51,3) | (52,58) |
| (18,33) | (34,62) | (42,53) | (46,26) | (52,19) | (53,93) |
| (19,25) | (37,113) | (41,31) | (47,14) | (53,95) | (54,57) |
| (24,18) | (35,37) | (39,3) | (44,15) | (54,79) | (55,126) |
| (31,124) | (33,33) | (42,26) | (48,36) | (55,113) | (56,86) |
| (26,68) | (38,33) | (40,80) | (46,97) | (56,8) | (57,24) |
| (29,65) | (35,24) | (41,20) | (45,125) | (57,8) | (58,3) |
| (20,60) | (37,33) | (43,116) | (46,42) | (58,25) | (59,85) |
| (25,77) | (34,9) | (40,118) | (44,67) | (59,32) | (60,1) |
| (27,11) | (38,65) | (43,87) | (47,14) | (60,123) | (61,40) |
| (36,30) | (41,119) | (44,33) | (61,26) | (62,92) | |
| (30,1) | (34,95) | (39,6) | (48,128) | (62,33) | (63,5) |
| (28,58) | (33,127) | (38,25) | (45,125) | (63,13) | (64,56) |
| (22,103) | (29,51) | (32,124) | (47,29) | (64,103) | (65,31) |
| (19,102) | (24,14) | (30,2) | (46,90) | (65,94) | (66,114) |
| (21,40) | (23,24) | (31,45) | (35,21) | (66,107) | (67,27) |
| (20,62) | (22,76) | (30,112) | (45,61) | (67,65) | (68,127) |
| (17,84) | (25,36) | (29,124) | (38,116) | (68,116) | (69,13) |
| (19,72) | (23,31) | (28,50) | (48,46) | (69,88) | (70,17) |
| (20,1) | (24,40) | (27,7) | (34,76) | (70,22) | (71,8) |
| (18,78) | (23,121) | (29,10) | (43,19) | (71,5) | (72,44) |
| (21,78) | (24,114) | (28,31) | (40,125) | (72,9) | (73,114) |
| (17,36) | (26,81) | (31,116) | (36,33) | (73,8) | (74,120) |
| (21,106) | (25,111) | (30,96) | (42,118) | (74,85) | (75,116) |
| (19,111) | (26,67) | (27,126) | (39,61) | (75,4) | (76,59) |
| (18,16) | (25,94) | (31,46) | (41,98) | (76,50) | (77,1) |
| (20,56) | (26,43) | (32,25) | (33,11) | (77,115) | (78,107) |
| (18,9) | (27,92) | (28,63) | (44,78) | (78,2) | (79,37) |
| (17,101) | (22,12) | (32,111) | (37,20) | (79,123) | (80,16) |

1300

FIG. 13 for i=2m+1 to 3m do  ⁀1401    ⁀1400 begin ⁀1415 for j=1 to m do ⁀1402 begin ⁀1425 if ($H_{j,i}$ =1) & ($H_{j,2m+1:i-1}$ =0).  ⁀1403

{

$s_{i-1} = s_{j-1}$ .  ⁀1404

} if ($H_{j,i}$ =1) & ($H_{j,k}$ =1, for k ∈ [2m+1, i-1]) .  ⁀1405

{

$s_{i-1} = s_{j-1} \oplus s_{k-1}$ .  ⁀1406

} end ⁀1426 end ⁀1416

FIG. 14 for i=3m+1 to 5m do  1501                                  1500 begin  1515 for j=m+1 to 3m do  1502 begin  1525 if ($H_{j,i}$ =1) & ($H_{j,3m+1:i-1}$ =0).  1503

{

$s_{i-1}$ =mod($H_{(j,1:3m)} \cdot \underline{S}_{0:3m-1}$,2)  1504

} if ($H_{j,i}$=1) & ($H_{j,k}$ =1, $k \in [3m+1, i-1]$).  1505

{

$s_{i-1}$ =mod($H_{(j,1:i-1)} \cdot \underline{S}_{0:i-2}$, 2)  1506

} end  1526 end  1516

FIG. 15

$$H_2 = \begin{bmatrix} 1 & 0 & 0 & 0 & \cdots & 0 & 0 & 0 & ⓵ \\ 1 & 1 & 0 & 0 & \cdots & 0 & 0 & 0 & 0 \\ 0 & 1 & 1 & 0 & \cdots & 0 & 0 & 0 & 0 \\ 0 & 0 & 1 & 1 & \cdots & 0 & 0 & 0 & 0 \\ \vdots & \vdots & \vdots & \vdots & \ddots & \vdots & \vdots & \vdots & \vdots \\ 0 & 0 & 0 & 0 & \cdots & 1 & 1 & 0 & 0 \\ 0 & 0 & 0 & 0 & \cdots & 0 & 1 & 1 & 0 \\ 0 & 0 & 0 & 0 & \cdots & 0 & 0 & 1 & 1 \end{bmatrix}$$

FIG. 16 for $i=2m+1$ to $2m+\text{ace\_exp}$   do ⌒1701
begin ⌒1715
for $j=1$ to $m$   do ⌒1402
   begin ⌒1725
   if $(H_{j,i}=1)$ & $(H_{j,2m+1:i}=0)$ ⌒1703
   {
    $s_{i-1}=s_{j-1}$ ⌒1404
   }
   end ⌒1726
end ⌒1716 for $i=2m+\text{ace\_exp}+1$ to $3m-\text{ace\_exp}$   do ⌒1711
begin ⌒1735
   for $j=1$ to $m$   do ⌒1402
   begin ⌒1745
   if $(H_{j,i}=1)$ & $(H_{j,k}=1, k \in [2m+1,i-1])$ ⌒1405
   {
    $s_{i-1}=s_{j-1} \oplus s_{k-1}$ ⌒1406
   }
   end ⌒1746
end ⌒1736 for $i=m-\text{ace\_exp}+1$ to $m$   do ⌒1751
begin ⌒1755
   $s_{i-1}=\text{mod}(H_{(j,m+1:end)} \cdot \underline{s}_{m:end}, 2)$ ⌒1752 end ⌒1756

FIG. 17

$S_{5m\text{-}ace\_exp:5m\text{-}1}=\underline{0}$ ~1799 for $i=3m+1$ to $3m+ace\_exp$ do ~1801
begin ~1815 for $j=m+1$ to $3m$ do ~1502
    begin ~1825 if $(H_{j,i}=1)$ & $(H_{j,3m+1:i\text{-}1}=\underline{0})$ ~1503

{

$s_{i\text{-}1}=\text{mod}(H_{(j,1:3m)}\cdot\underline{S}_{0:3m\text{-}1},2)$ ~1504

} end ~1826
end ~1816 for $i=3m+ace\_exp+1$ to $5m\text{-}ace\_exp$ do ~1811
begin ~1835 for $j=m+1$ to $3m$ do ~1502
    begin ~1845 if $(H_{j,i}=1)$ & $(H_{j,k}=1, k \in [3m+1, i\text{-}1])$ ~1505

{

$s_{i\text{-}1}=\text{mod}(H_{(i\text{-}2m\text{-}ace\_exp,1:i\text{-}1)}\cdot\underline{S}_{0:i\text{-}2},2)$ ~1806

} end ~1846
end ~1836 for $i=5m+1$ to $5m+ace\_exp$ do ~1851
begin ~1855

$s_{i\text{-}1}=\text{mod}(H_{(j,1:i\text{-}1)}\cdot s_{0:i\text{-}2},2)$ ~1852 end ~1856

PARITY CHECK MATRIX

TECHNICAL FIELD

An embodiment relates to integrated circuit devices ("ICs"). More particularly, an embodiment relates to a parity check matrix in an IC.

BACKGROUND

Forward Error Correction ("FEC") is used in many communication systems, including without limitation wireless communications systems. One type of codes used for FEC are low density parity-check ("LDPC") codes. LDPC codes may be found in various specifications, including without limitation IEEE 802.11n and 802.11ac ("WiFi"), IEEE 802.16 ("WiMax"), WiMedia UWB, and DVB-S2, among others. Furthermore, LDPC codes may be used in various proprietary systems without adherence to a particular published specification, including for example a microwave backhaul for communication to and from a base station in a cellular or wireless network.

A subclass of LDPC codes are accumulate-repeat-accumulate codes ("ARA"). ARA codes may have an error correcting capability with a low error floor and may be encoded in linear time. However, for LDPC codes, including without limitation ARA codes, encoders and decoders for such have been too complex and/or too large. This has made employing such LDPC codes less competitive than other types of FEC codes, such as for example Reed-Solomon codes, convolutional codes with a Viterbi decoder, and Turbo codes.

Accordingly, it would be desirable and useful to provide an LDPC encoder and/or decoder that is less complex than prior LDPC encoders and/or decoders, so as to make LDPC codes more competitive with respect to usage of other types of FEC codes.

SUMMARY

An apparatus generally relates to a parity check matrix. In such apparatus, at least one coder block has such parity check matrix. The parity check matrix comprises each element of an H matrix expanded by a Progressive Edge Growth ("PEG") expansion factor and an Approximate Cycle Extrinsic Message Degree ("ACE") expansion factor.

A method generally relates to providing a parity check matrix. In such method, an H matrix is obtained by a coder (e.g., an encoder or decoder). The H matrix is expanded by the coder to provide a parity check matrix. The expanding includes replacing each element of the H matrix with an m×m submatrix therefor to provide an expanded H matrix for m a positive integer expansion factor, Progressive Edge Growth ("PEG") expanding the expanded H matrix to provide a PEG expanded matrix, and ACE expanding the PEG expanded matrix to provide the parity check matrix. The coder outputs information using the parity check matrix.

BRIEF DESCRIPTION OF THE DRAWINGS

Accompanying drawings show exemplary embodiments. However, the accompanying drawings should not be taken to limit the embodiments shown, but are for explanation and understanding only.

FIG. 6 is a listing depicting an exemplary conventional progressive edge growth ("PEG") flow.

FIG. 7 is a matrix diagram depicting an exemplary accumulator structure.

FIG. 9 is a listing depicting an exemplary ACE flow.

FIG. 10 is a listing of an exemplary conventional ACE detection flow.

FIG. 11 is a listing depicting an exemplary parity check matrix.

FIG. 13 is a listing depicting an exemplary optionally expressed parity check matrix for the parity check matrix of FIG. 11.

FIG. 14 is a listing depicting an exemplary punctured variable nodes encoding flow.

FIG. 15 is a listing depicting an exemplary variable nodes encoding flow.

FIG. 16 is a matrix diagram depicting an exemplary tail biting accumulator structure.

FIG. 17 is a listing depicting an exemplary punctured variable nodes encoding flow for encoding with a tail biting bit.

FIG. 18 is a listing depicting an exemplary variable nodes encoding flow for tail biting.

FIGS. 26 through 41-2 are multiple listings depicting respective exemplary parity check matrices associated with Tanner Graph representations of ARA4 codes without tail biting.

FIGS. 42-1 through 59-2 are multiple listings depicting respective exemplary parity check matrices associated with Tanner Graph representations of ARA4 codes with tail biting.

DETAILED DESCRIPTION

Figure 1:
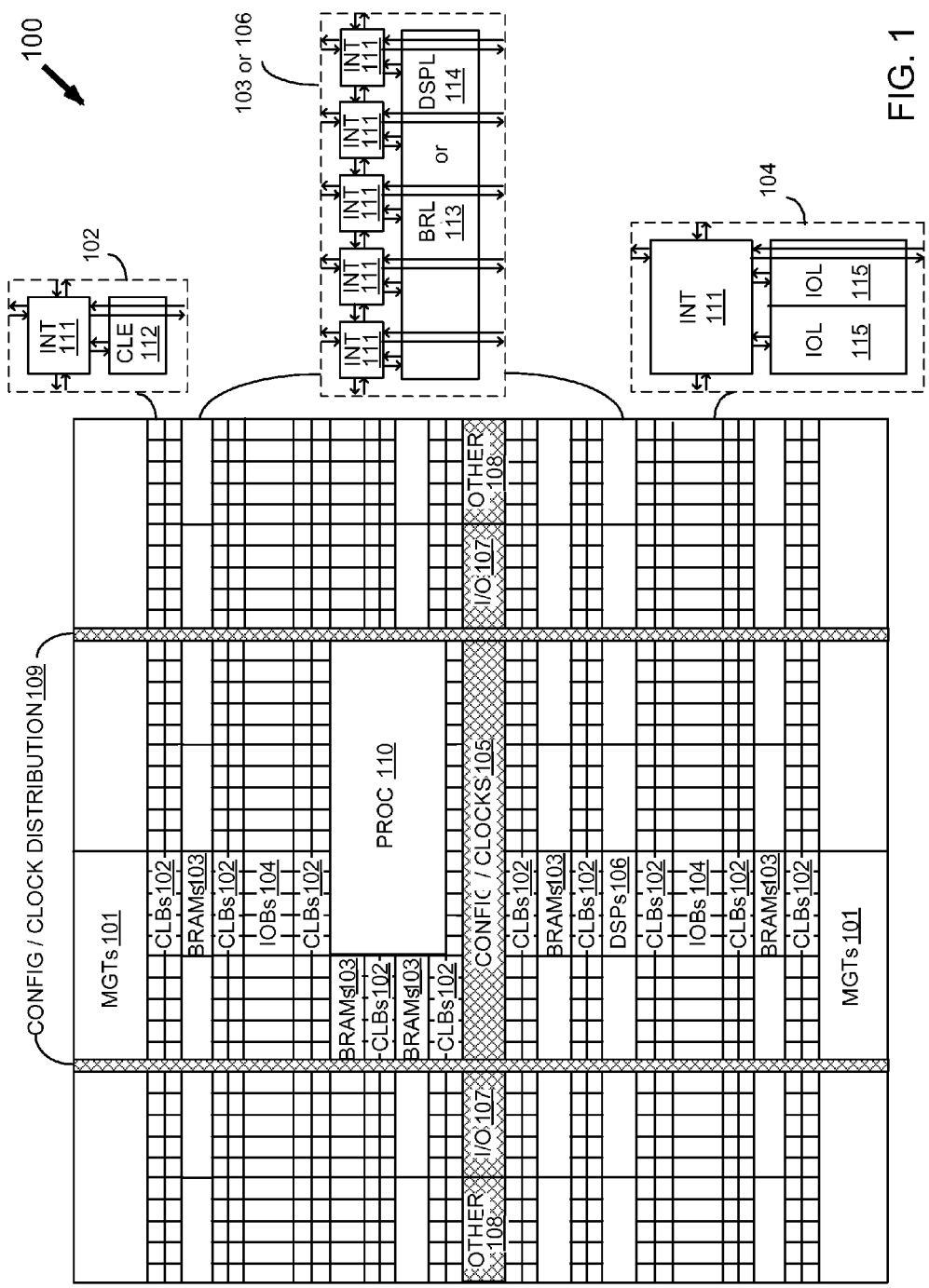
FIG. 1 is a simplified block diagram depicting an exemplary columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding. Accordingly, an LDPC encoder and an LDPC decoder each of which is less complex than prior LDPC encoders and decoders is described. LDPC codes are described below in terms of Tanner Graphs therefor. LDPC codes can be found in standards such as 802.11n and 802.11ac ("WiFi"), WiMax 802.16, WiMedia UWB, and DVB-S2, among others. LDPC codes may be used for microwave backhaul systems. Such LDPC codes may be used to provide low error floors, such as for example approximately $9*10^-10$ for input block lengths of 4096 bits, and much lower error floors may be provided for longer block lengths, such as for example input block lengths of 8192 bits. For example, using programmable resources, encoders and decoders of reasonable complexity, such as approximately 30,000 lookup tables each, may be used for microwave backhaul systems. With these parameters, bit error rate ("BER") performance may have an error floor of approximately $9*10^-9$ at approximately 1.35 dB for an input block length of approximately 4,000 and at approximately 1.20 dB for an input block length of approximately 8,000. Along those lines, such LDPC codes may be extremely competitive in terms of area and performance.

With the above general understanding borne in mind, various embodiments for parity check matrix generation, encoders, encoding flows, decoders, decoding flows, and systems are generally described below.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices.

In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

As described below in additional detail, accumulate-repeat-accumulate codes ("ARA"), which are a subclass of low density parity-check ("LDPC") codes, are described. ARA codes may have an error correcting capability and may be encoded in linear time. Parity check matrix construction for ARA codes are described below in additional detail, along with encoding and decoding as associated therewith. Even though the term "parity check matrix" is used, it should be understood that such a data structure may be embodied in hardware and/or software.

Figure 2:
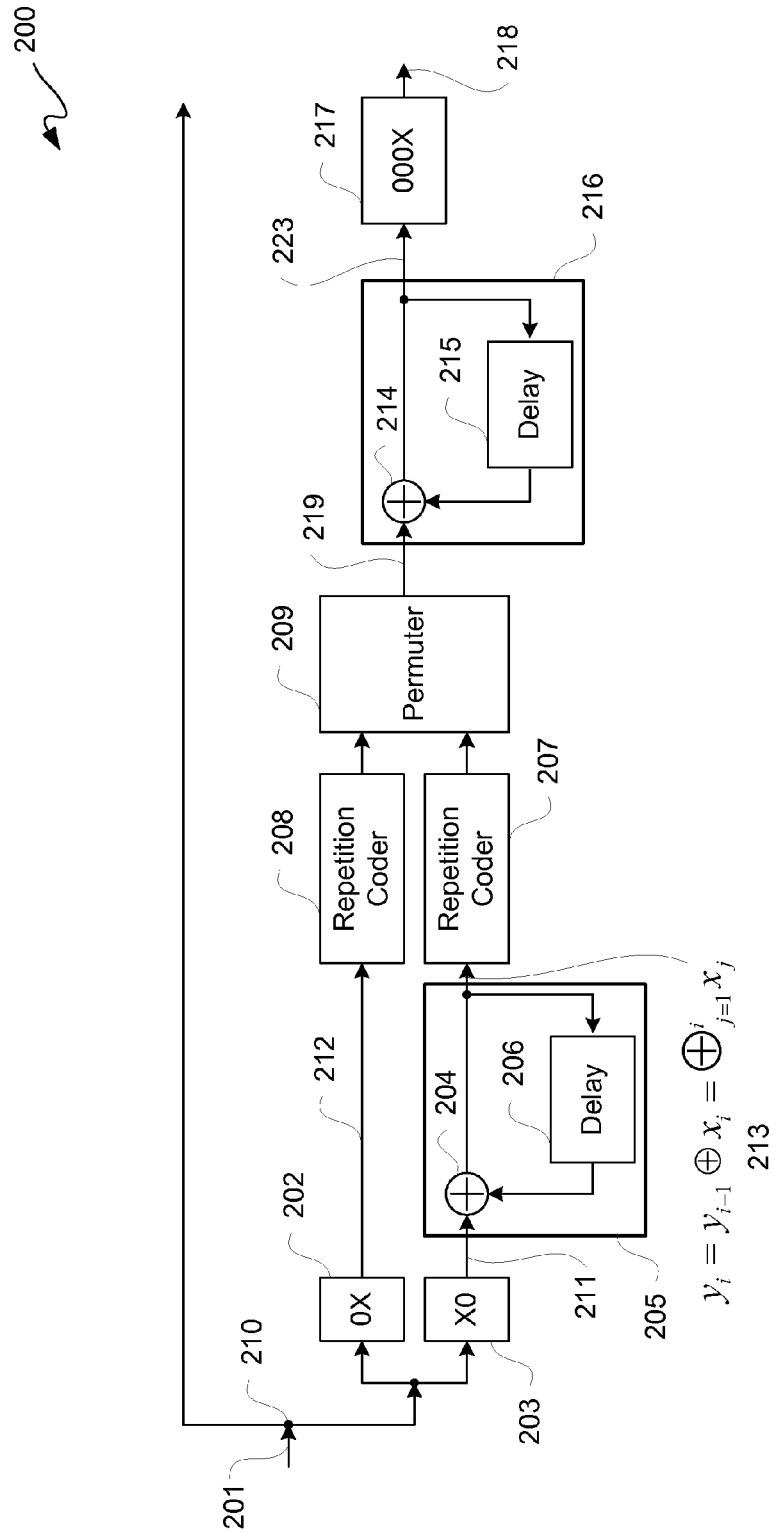
FIG. 2 is a block diagram depicting an exemplary encoder.

FIG. 2 is a block diagram depicting an encoding process of an ARA encoding process 200. ARA encoding process 200 depicts steps a set of input bits pass through and modifications they undergo at every step. At the end of ARA encoding process 200, input data bits and parity bits, derived from such input bits, are depicted. A protograph may then be expanded with help of other algorithms to generate a final parity check matrix to provide an AR4A LDPC code.

Along the above lines, encoding process 200 may be coupled to receive input 201 and configured to provide such input 201 as output along with outputting check information 218 for such input data 201 output. For purposes of clarity by way of example and not limitation, input 201 is referred to as input bits 201, and check information 218 is referred to check bits or parity bits 218. Description of encoding process 200 is a general description of an ARA encoding process.

Encoding process 200 is configured for an AR4A encoder. Though other types of ARA codes may be used, AR4A codes may provide error correcting capability in excess of other ARA codes. Along those lines, encoding process 200 includes input index filters 202 and 203, an input accumulator ("precoder") 205, repetition coders ("repeaters") 207 and 208, a permuter 209, an output accumulator 216, and an output index filter 217. For an AR4A code, repetition coders 207 and 208 are repetition 4 coders, meaning that there are four repeats for each coding instance.

Inputs of input index filters 202 and 203 are coupled to input/output node 210. Each input index filter 202 and 203 receives input bits 201. On even side data path, input index filter 202 is labeled with an "0X", which means that an even puncturing pattern is used. In other words, every even index of input bits 201 is passed by input index filter 202, and every odd index of input bits 201 is blocked or filtered out by input index filter 202. On odd side data path, input index filter 203 is labeled with an "X0", which means that an odd puncturing pattern is used. In other words, every odd index of input bits 201 is passed by input index filter 203, and every even index of input bits 201 is blocked or filtered out by input index filter 203. So, for example, for a string of input bits 201 being 1011, where bits 0 and 1 respectively in positions two and zero are even and where bits 1 and 1 respectively in positions three and one are odd, then input index filter 202 would pass [−0−1], and input index filter 203 would pass [1−1−].

Output of input index filter 203 may be provided as a punctured version of input bits 201 to accumulator 205. Even though accumulator 205 is located on an odd side data path, accumulator 205 may be located on an even side data path in other examples. A bitwise adder 204 of accumulator 205 may be coupled to receive such punctured version of input bits 201, namely odd index bits 211, from input index filter 203. Such a bitwise adder 204 may be provided using XOR gating. Output of adder 204 may be provided as precoded or accumulated output 213 for input to delay 206 of accumulator 205 and to repetition coder 207. If input to accumulator 205 is denoted as $x_i$ and output of accumulator 205 is denoted as $y_i$, then, using a plus sign in a circle to denote an XOR operation for bitwise addition, output of accumulator 205 may be mathematically expressed as:

$$y_1 = x_1, y_2 = x_1 \oplus x_2 = y_1 \oplus x_2, y_3 = x_1 \oplus x_2 \oplus x_3 = y_2 \oplus x_3.$$

More generally, accumulated or precoded output 213 of accumulator 205 may be mathematically expressed as indicated in FIG. 2.

Another or opposite punctured version of input bits 201, namely even index bits 212, which are output from input index filter 202, may be provided as input to repetition coder 208. Output from each of repetition coders 207 and 208 may be provided as respective encoded inputs to permuter 209. Again, repetition coders 207 and 208 are repetition 4 coders for an AR4A code.

Permuter 209 may be configured to permutate or change the order of bits received from repetition coders 207 and 208. This permuting or re-ordering is described below in additional detail. Permutated information 219, such as reordered bits, may be provided as an input to a bitwise adder 214 of output accumulator 216. Such a bitwise adder 214 may be provided using XOR gating, such as previously described with reference to bitwise adder 204 and accumulated output 213. Output of adder 214 may be provided as accumulated output 223 for input to delay 215 of accumulator 216 and to output index filter 217.

Output index filter 217 is labeled with an "000X", which means that in each grouping of four bits, the last bit in such grouping is passed and the first 3 bits are punctured. Thus, if a grouping of four bits were for example 1111, output of such four bits from output index filter 217 may be [−−−1]. This puncturing pattern may be used for an AR4A code output.

Check or parity information, such as check bits 218 for example, output from output index filter 217 may be used to provide an AR4A encoding of input data 201. In this example, a code rate of 1:2 is used, namely there is one check bit for each data bit. However, other code rates may be used for ARA coding.

Figure 3:
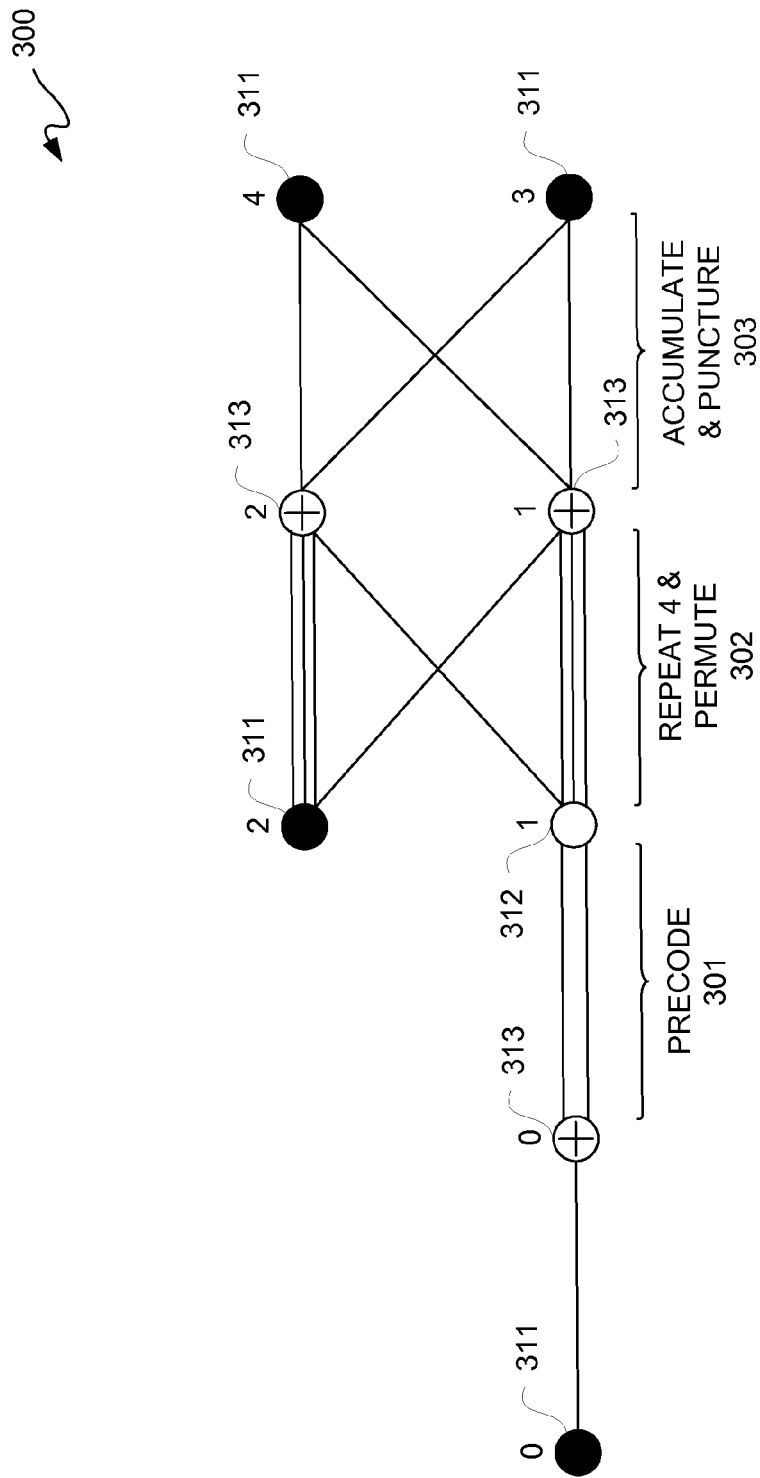
FIG. 3 is a graph depicting an exemplary protograph for an accumulate-repeat-accumulate ("ARA") code.

ARA codes, including AR4A codes, may be represented with a "protograph." FIG. 3 is a graph depicting an exemplary protograph 300 for AR4A codes. Dark circles 311 generally represent bits that are transmitted through a channel. Blank circle 312 represents punctured bits; in other words, bits that are not transmitted through a channel but are nonetheless used for decoding. For purposes of clarity by way of example and not limitation, dark circles 311 with numbers 0 and 2 may represent actual information bits, where 0 may correspond to every even information bit (or first half) and where 2 may correspond to every odd information bit (or second half). For purposes of clarity and not limitation, it shall be assumed that information bits are split into a first half and a second half. Blank circle 312 with a number 1 may represent an accumulator output of a first half of information bits. All circles 313 with (+) signs in them may represent check nodes. Dark circles 311 with numbers 3 and 4 may correspond to variable nodes represented by a dark circle 311 with a number 2 and blank circle 312 with a number 1 being repeated, permuted, accumulated and then punctured according to a "000X" pattern. Using protograph 300, a parity check matrix of an AR4A code may be generated, as described below in additional detail.

The above-described encoding process is provided for background.

Figure 4:
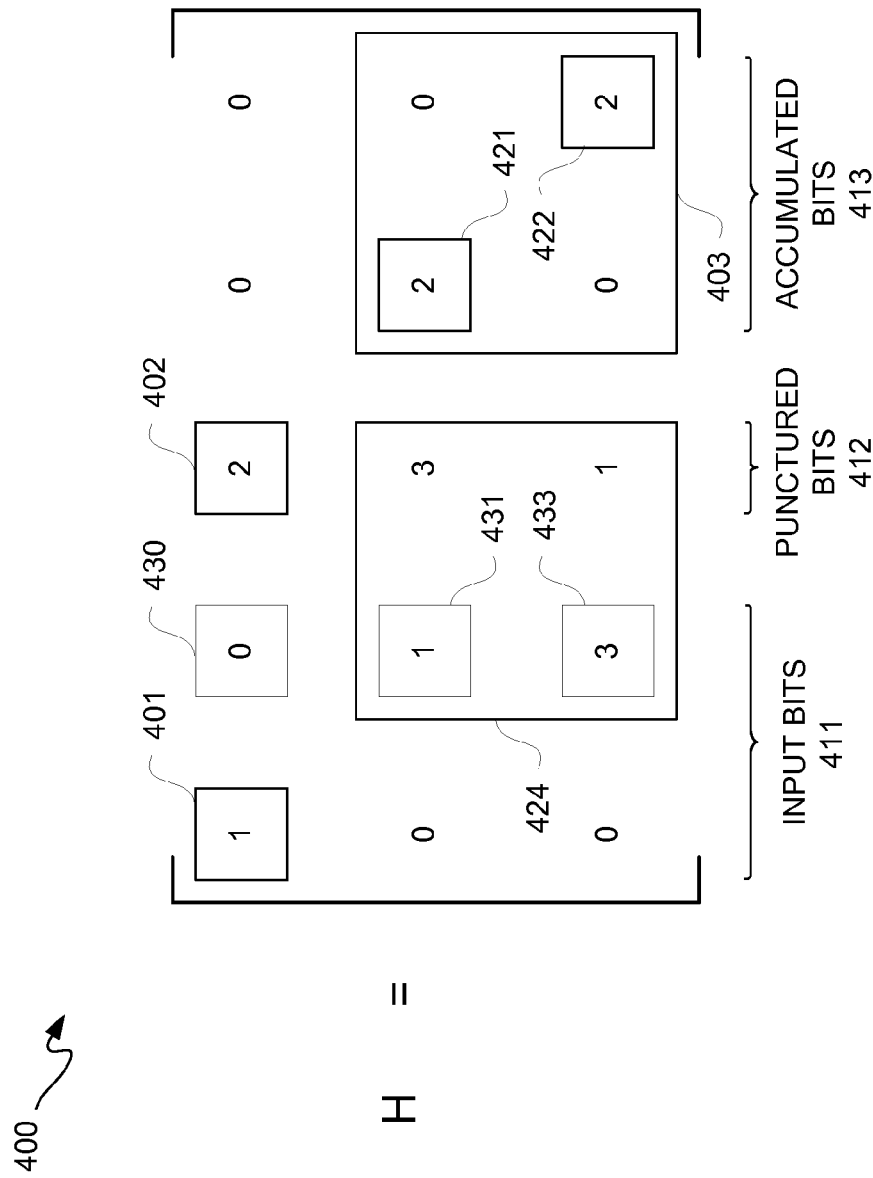
FIG. 4 is a matrix diagram depicting an exemplary matrix representation of a protograph.

FIG. 4 is a matrix diagram depicting an exemplary matrix H 400 representation of a protograph. Matrix H 400 is not a parity check matrix; however, matrix H 400 may be used to generate a parity check matrix, as described below in additional detail. Using matrix H 400, a parity check matrix may be systematically constructed, as described herein.

In this example, the first two columns of matrix H 400 are populated with input bits 411 from input bits 201. The third or middle column of matrix H 400 in this example is populated with punctured bits 412. The last two columns of matrix H 400 are populated with accumulated bits 413.

Matrix H 400 may be expanded or replicated. The number of replications, m, is referred to herein as the "expansion factor."

Matrix H 400 in this example is a 3×5 matrix. Suppose for purposes of clarity by way of example and not limitation, a 3m×5m matrix expansion of matrix H 400 was to be obtained. Matrix H 400 may be used to provide such 3m×5m representation.

A parity check matrix may be constructed by expanding each element $H_{i,j}$ of matrix H 400 with an m×m submatrix therefor. If an element $H_{i,j}$ of matrix H 400 equals 0 (i.e., $H_{i,j}=0$), then a corresponding m×m submatrix would be an all-zero matrix. However, if an element $H_{i,j}$ of matrix H 400 was a non-zero value, then a corresponding m×m submatrix would generally have $H_{i,j}$ many 1s in each row and each column. There is an exception for a non-tail biting example, as described below in additional detail. For example, $H_{i,j}$ for i=1 and j=1 in matrix H 400, namely H matrix element 401, is a numeral 1, and for an expansion factor of 100, a submatrix expansion of such an element would be a 100×100 submatrix, where there is exactly one logic 1 in every row and in every column, such an identity matrix or a shifted identity matrix. Moreover, for example, $H_{i,j}$ for i=3 and j=2 in matrix H 400 has a numeral 3, and for an expansion factor of 100, a submatrix expansion of such an element would be a 100×100 submatrix where there were a total of three logic 1s in every row and in every column. In most instances, there may be exactly $H_{i,j}$ many 1s in each row and each column. For purposes of clarity, an expanded matrix H may be referred to as $H_{exp}$.

At this point, it should be borne out that effectively a parity check matrix is descriptively being generated in a systematic manner as described herein. This systematic creation of a parity check matrix for an ARA code facilitates providing a less complex ARA encoder and/or decoder having modular structure which may be parallelized. This parallelization is scalable up or down, so, generally, for large throughput a large number of blocks may be used in parallel, and for small throughput a small number of blocks may be used in parallel.

Expansion of matrix H 400 may be implemented in an entirely random manner, namely each element $H_{i,j}$ may be expanded with an m×m random circulant matrix with $H_{i,j}$ many elements on average in each row and each column. Along those lines, the number of logic 1s, or the absence thereof, in each m×m submatrix of a matrix $H_{exp}$ provides randomness.

Continuing the above example of a 3×5 matrix H 400 with an expansion factor of m equal to 100, effectively a 300×500 matrix $H_{exp}$ may result, namely a matrix H 400 with 15 submatrices each of which is 100×100. Position of logic 1s in such submatrices may be generated randomly provided constraints corresponding to matrix H 400 are generally maintained. For example, even though elements 402, 421, and 422 of matrix H 400 are all 2s in this example, m×m submatrices generated respectively therefor where each row and column has exactly two logic 1s may be different matrices. In other words, equivalent non-zero $H_{i,j}$ elements do not necessarily result in equivalent submatrices from an expansion of such elements, and along those lines, such submatrices may be randomly generated subject to identified constraints.

A progressive edge growth ("PEG") process described with reference to FIG. 8 below may be used for having constraints on expansion of matrix H 400, and thus matrix H 400 may be expanded by an expansion factor and expanded by a PEG process at the same time, or expansion by a PEG process may follow expansion by an expansion factor. For example, with reference to submatrices 424, there are two submatrices where each row and column in combination has on average one non-zero entry, namely a logic 1, and there are two submatrices where each row and each column has on average three non-zero entries, namely three logic 1s. These submatrices 424, which are not of a fixed configuration, may be expanded, using such constraints on numbers of logic 1s in rows and columns as described, with a PEG process. However, submatrices 401 through 403 may all be fixed, as described below, and all other submatrices remaining are all zero entry submatrices.

However, such a random expansion may result in many short cycles within $H_{exp}$, and hence reduce error correcting capability of an ARA code. In other words, in the continued systematic building of a parity check matrix, such an expansion may not be sufficiently large to sufficiently avoid short cycles. In order to avoid or reduce the likelihood of these short cycles, a modified PEG process may be used to increase a shortest cycle, known as "girth," in a parity check matrix. Such increase in a shortest cycle of a parity check matrix may increase an error floor of an LDPC code, including an ARA code.

Figure 5:
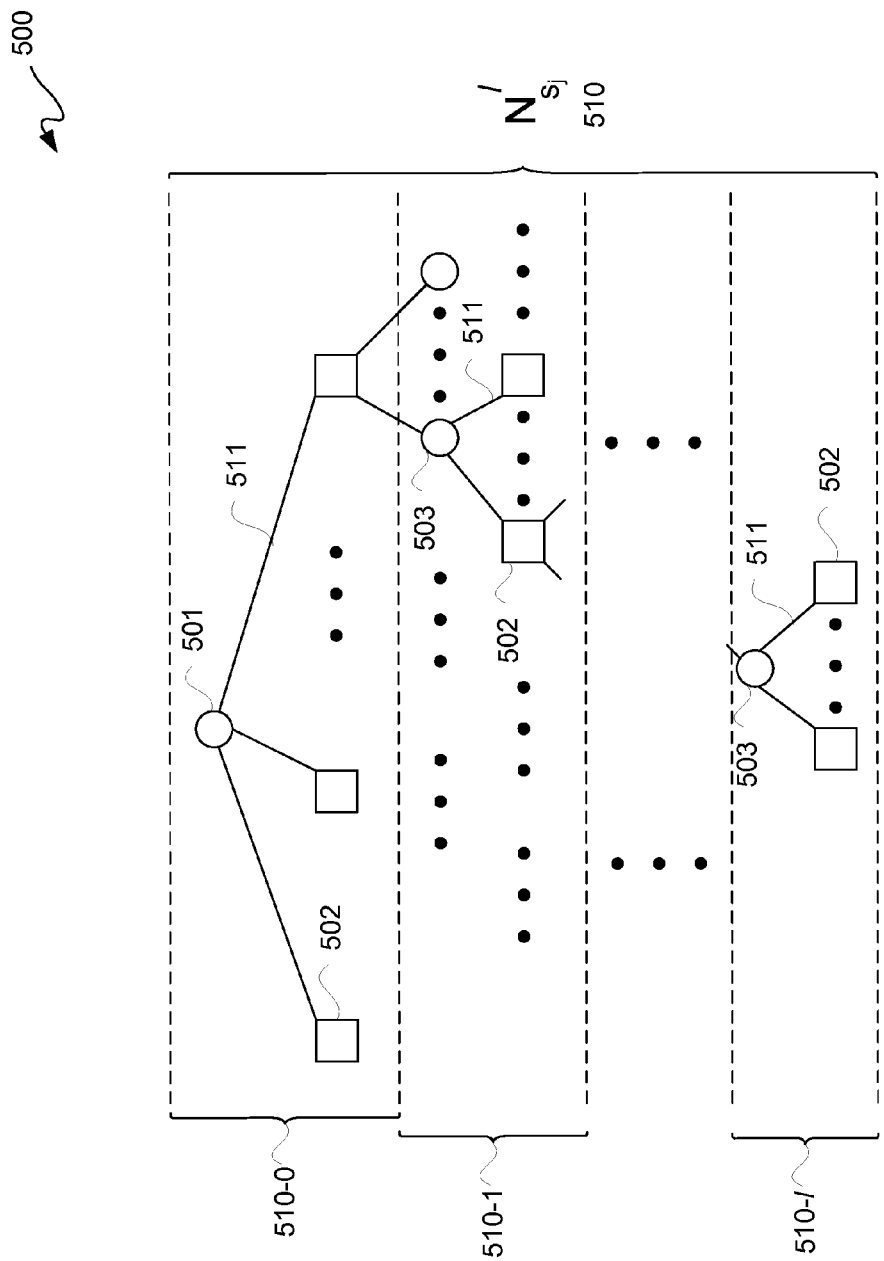
FIG. 5 is a tree diagram depicting an exemplary subgraph.

FIG. 5 is a tree diagram depicting an exemplary subgraph 500. Subgraph 500 generally describes a PEG to increase a shortest cycle. PEG of matrix H 400 may be performed after expansion by an expansion factor or while expansion by an expansion factor is occurring. For purposes of clarity and not limitation, it shall be assumed that PEG and expansion with an expansion factor happen at the same time, and thus such expansion factor is referred to herein as $m_{peg}$. If a row and a column of a matrix have a logic 1 for example, such a logic 1 generally represents an edge between a node associated with such row and a node associated with such column.

Denoting a variable node $s_j$ as a $(j+1)^{th}$ variable node 501 of a parity check matrix, its neighborhood within depth l may be denoted as $N_{s_j}^1$ being from $s_j$ to 1, as indicated as neighborhood 510. Neighborhood 510 may be thought of as a set consisting of all check nodes 502 which can be reached by a subgraph 500 spreading from a variable node 501 down to a depth of l, from an uppermost level 510-0 to a lowermost level 510-l of subgraph 500. Lines interconnecting nodes indicate edges 511

FIG. 6 is a listing depicting an exemplary conventional PEG flow 600. With simultaneous reference to FIGS. 4 through 6, PEG flow 600 is further described.

In PEG flow 600, n generally denotes a number of variable nodes 503, including a selected variable node 501, in a parity check matrix; $d_{s_j}$ generally denotes a degree of a variable node 501; and $E_{s_j}$ generally denotes a set of all edges connected to a variable node 501, where edge $E_{s_j}^k$ for k equal to 0 is an initial edge connected to a variable node 501, and where edge $E_{s_j}^k$ is a $(k+1)^{th}$ edge connected to a variable node 501. An $(i+1)^{th}$ check node 502 in a parity check matrix is denoted as "$c_i$," and $\overline{N}_{s_j}^l$ generally denotes a set of all the variable nodes in a parity check matrix with a set $N_{s_j}^l$ excluded therefrom.

With the above understanding of terms borne in mind, PEG flow 600 is further described. At 601, values of j from 0 to n−1 are initialized. At 605, an outer do loop may be initiated for a number of variable nodes defined at 601 in a parity check matrix, and such outer do loop may end at 606. At 602, values for k from 0 to degree $d_{s_j}$ minus 1 may be initialized for an inner do loop. Such inner do loop, which is nested in such outer do loop, may begin at 615 and end at 616.

At 603, for k equal to 0, a current check node-variable node edge $(c_i, s_j)$ is set to an initial edge $E_{s_j}^0$, such that such initial edge for k equal to 0 has a lowest check node degree under a current subgraph 500 setting $E_{s_0} \cup E_{s_1} \ldots E_{s_{j-1}}$.

For values of k not equal to 0, at 604, subgraph 500 is expanded from a symbol or variable node up or down to a depth l under a current subgraph setting such that cardinality of $N_{s_j}^l$ stops increasing but is less than a total number of check nodes, namely a set of variable nodes is not equal to zero or $\overline{N}_{s_j}^l \neq \emptyset$. However, for l+1 for such set, such set is equal to zero or $\overline{N}_{s_j}^{l+1} = \emptyset$, and so at 604 a current check node-variable node edge $(c_i, s_j)$ may be set to $E_{s_j}^k$, where edge $E_{s_j}^k$ is $(k+1)^{th}$ edge incident to $s_j$ and an $c_i$ is an element of set variable nodes or $c_i \in \overline{N}_{s_j}^l$. Degree of $c_i$ may be the smallest among all other check nodes in such set $\overline{N}_{s_j}^l$.

Conventional PEG flow 600 is not useable for ARA codes. However, a PEG flow is described below which may be used for ARA codes, including without limitation AR4A codes. Along those lines, such a PEG flow may accommodate protograph structure of AR4A codes. Additionally, parts of a parity check matrix may be fixed to implement an accumulator in accordance with such a PEG flow.

Returning to FIG. 4, for matrix H 400 to be expanded by a factor m, submatrix $H_1$ 401 may be fixed to be an m×m identity matrix. Furthermore, m×m submatrix $H_2$ 402 and 2m×2m submatrix $H_3$ 403 may be respective fixed submatrices, as described with reference to FIG. 7.

FIG. 7 is a matrix diagram depicting an exemplary accumulator structure 700. Accumulator structure 700 is described with simultaneous reference to FIG. 4. Accumulator structure 700 may be a fixed structure of submatrix $H_2$ 402. Submatrix $H_2$ 402 may be mathematically expressed as:

$$H_{2_{i,j}} = \begin{cases} 1 & \text{for } (i = j) \text{ or } (i = j + 1) \\ 0 & \text{otherwise} \end{cases} \quad (1)$$

Submatrix $H_2$ 402 may be implemented as a fixed precoder or accumulator structure. Non-zero submatrices of submatrix $H_3$ 403 are constructed generally the same as submatrix $H_2$ 402, with the only difference being that submatrix $H_3$ 403 is a 2m×2m matrix, and there are two all zero submatrices in addition to two submatrices that look just like submatrix $H_2$ 402.

Above, it was mentioned that each row and column has a constrained number of logic 1s according to matrix H 400. However, submatrix $H_2$ 402, as well as submatrices 421 and 422 of submatrix $H_3$ 403, have only a single logic 1 in a first row thereof and a single logic 1 in a last column thereof. For a non-tail biting configuration, these are the exceptions to the above stated general rule of having exactly as many logic 1s in each row and column as constrained by non-zero elements of matrix H 400. For a tail biting configuration, an upper-leftmost element would be a logic 1 in each of submatrices 402, 421, and 422.

To expand matrix H 400 by a factor of m using a modified PEG process with submatrices 401 through 403 fixed as previously described, $N_{proto,s_j}^k$ is defined as a connectivity criterion associated with a protograph. For example, $s_m$ in an expanded protograph may correspond to a variable node belonging to a second column of matrix H 400, where m is an expansion factor. Thus, for example in a second column of matrix H 400, from a top row to a bottom row there are 0, 1, and 3 submatrices after expansion, and so $s_m$ in an expanded protograph may correspond to a first variable node in a first column of an expanded submatrix 430 in the second column of matrix H 400. Thus, constraints for a PEG process for a variable node $s_m$ may be described as follows. A variable node $s_m$ cannot be connected to a first m check node, as submatrix 430 is an all zero entry matrix; a variable node $s_m$ can be connected between a check node m and a check node 2m at only one edge, as submatrix 431 is a one logic 1 on average per row and column matrix; and a variable node $s_m$ can be connected between a check node 2m and a check node 3m at only three edges, as submatrix 433 is a three logic 1s on average per row and column matrix.

Hence, when the first edge $E_{s_m}^0$ is inserted into a protograph of $s_m$, such first edge may be chosen from a check node set $\{c_m, c_{m+1}, \ldots, c_{2m-1}\}$. Thus, connectivity for k=0 may be described as $N_{proto,s_m}^0 = \{c_m, c_{m+1}, \ldots, c_{2m-1}\}$. Similarly when edges $E_{s_m}^1, E_{s_m}^2, E_{s_m}^3$ are inserted into such a protograph, $E_{s_m}^1, E_{s_m}^2, E_{s_m}^3$ may be chosen from:

$$N_{proto,s_m}^1 = N_{proto,s_m}^2 = N_{proto,s_m}^3 = \{c_{2m}, c_{2m+1}, \ldots, c_{3m-1}\}. \quad (2)$$

For $s_{2m}$, namely a variable node that belongs to a third column of matrix H 400, connectivity may be described as:

$$N_{proto,s_{2m}}^1 = N_{proto,s_{2m}}^2 = N_{proto,s_{2m}}^3 = \{c_m, c_{m+1}, \ldots, c_{m-1}\} \quad (3)$$

and $$N_{proto,s_{2m}}^4 = \{c_{2m}, c_{2m+1}, \ldots, c_{3m-1}\}. \quad (4)$$

For this variable node, connectivity for k=0, namely $N_{proto,s_{2m}}^0$, is predetermined due to fixing an accumulator portion of a parity check matrix.

Figure 8:
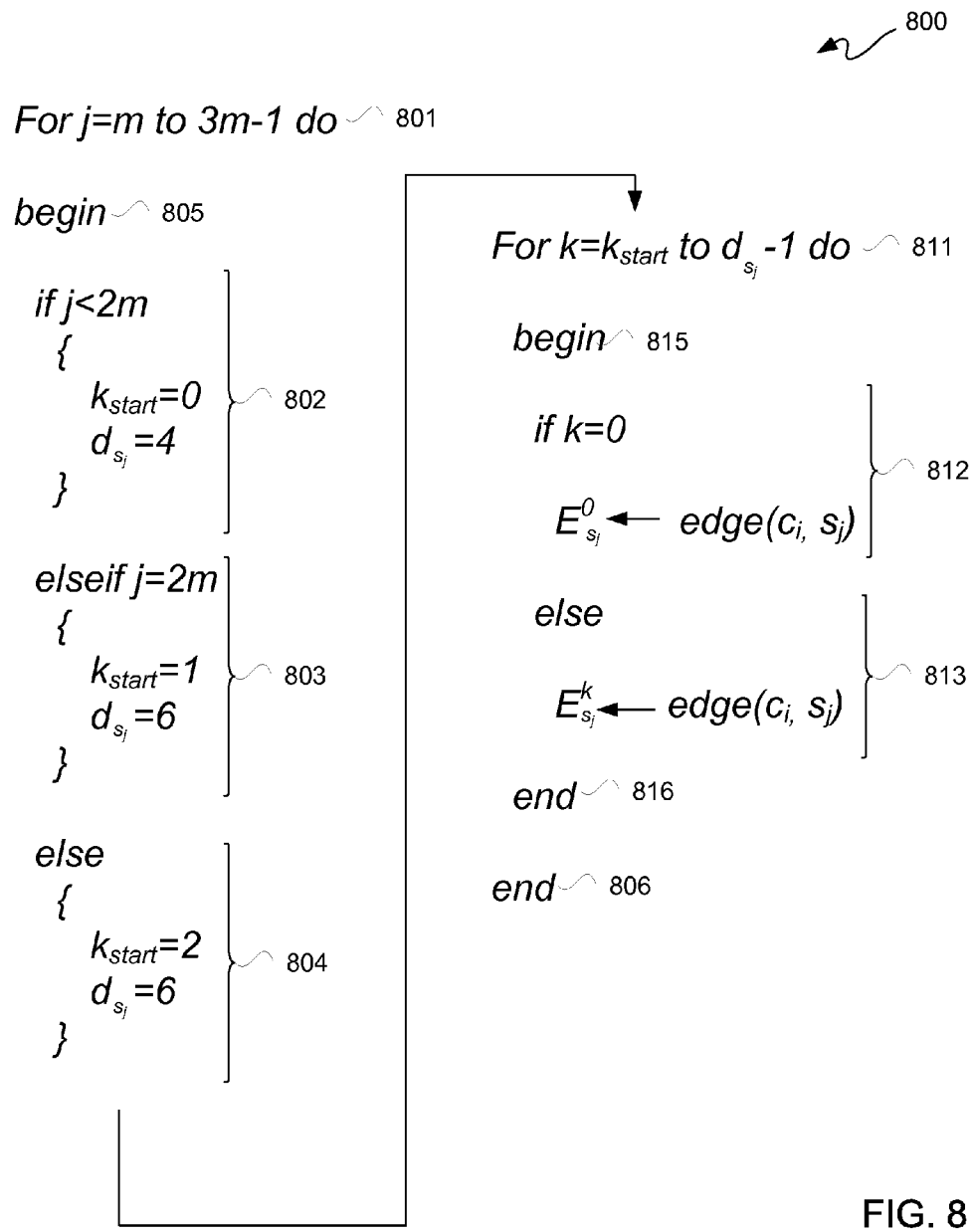
FIG. 8 is a listing depicting an exemplary PEG flow.

FIG. 8 is a listing depicting an exemplary modified PEG flow 800. Modified PEG flow 800 may provide a further expansion of an m expanded matrix H 400. Before modified PEG flow 800 is applied, portions of matrix H 400 after expansion may be fixed. More particularly, portions of an expanded matrix H 400 representing a precoder and an output accumulator, namely submatrix $H_2$ 402 and submatrix $H_3$ 403, respectively, may be fixed. For example, as matrix H 400 is expanded, submatrix $H_2$ 402 and submatrix $H_3$ 403 may be generated to have the particular structures, namely fixed structures, previously described with reference to FIG. 7.

Operations 801 through 804 are for an outer do loop, which begins at 805 and ends at 806. At 801, a range for j from m to 3m−1, for m an expansion factor, of variable nodes is defined for an outer do loop. Recall, that submatrices 401, 402, and 403 are fixed, and thus range of j may be correspondingly limited as no edges are set by a PEG process for fixed submatrices.

At 802, for variable nodes s of index j<2m, $k_{start}$ is set to equal 0 and degree for such nodes is set equal to 4, namely $d_{s_j}=4$. For j<2m means a location in a second column of matrix H 400. At 803, for variable nodes s of index j=2m, $k_{start}$ is set to equal 1 and degree for such nodes is set equal to 6, namely $d_{s_j}=6$. At 804, for variable nodes s of all other indices not covered at 802 and 803, namely for a location in a third column of matrix H 400, $k_{start}$ is set to equal 2 and degree for such nodes is set equal to 6, namely $d_{s_j}=6$. Because submatrices 401 through 403 are fixed, when indexed variable nodes are started at $k_{start}$, a starting value for k is set so as not to set edges for fixed submatrices.

Operations 811 through 813 are for an inner do loop, which begins at 815 and ends at 816, and which is nested in the outer do loop. At 811, a range of k is set from a $k_{start}$ to a degree d−1 for a variable node $s_j$, both a $k_{start}$ and a degree d value are obtained as set by an outer do loop, as previously described, depending on index j. Again, fixed submatrices are avoided. If k equals 0, then at 812 an initial edge $E_{s_j}^0$ for a ($c_i$, $s_j$) node is set, where such initial edge is the first edge incident to such variable node $s_j$, and where connectivity for such check node, namely $c_i \in N_{proto,s_j}^0$, has the lowest check node degree under a current graph setting of $E_{s_0} \cup E_{s_1} \ldots \cup E_{s_{j-1}}$. The range of i is implicitly used in the connectivity neighborhoods. Setting an initial edge does not result in a cycle, as a cycle involves at least two edges from a variable node, namely at least one edge to leave a variable node and at least one edge to return to such variable node. However, after an initial edge is set, care may be taken to avoid setting an edge which results in a cycle.

If, however, k does not equal 0, then at 813 a subgraph, such as subgraph 500 of FIG. 5 for example, is expanded from a variable or symbol node $s_j$ up or down to a depth l under a current graph setting such that: cardinality of $N_{s_j}^l \cap N_{proto,s_j}^k$ stops increasing but is less than $|N_{proto,s_j}^k|$, or $\overline{N}_{s_j}^l \neq \emptyset$; and $\overline{N}_{s_j}^l \cap N_{proto,s_j}^k \neq \emptyset$ but $\overline{N}_{s_j}^{l+1} \cap N_{proto,s_j}^k \neq \emptyset$. In other words, a maximum number of variable nodes that may be reached is limited to the total number of variable nodes, so if a variable node is selected outside of l, then such variable node cannot result in a cycle. In this sense, PEG flow 800 may be considered a "greedy" flow in accordance with the expansion illustratively depicted in FIG. 5. It may be impossible in some situations to avoid a cycle; however, by expanding to increase depth l, then a shortest cycle length may be equal to 2l.

Furthermore, at 813, an edge $E_{s_j}^k$ is set for a ($c_i$, $s_j$) node, where $E_{s_j}^k$ may be the $(k+1)^{th}$ edge incident to a ($c_i$, $s_j$) node for $c_i \in \overline{N}_{s_j}^l \cap N_{proto,s_j}^k$, and where degree of $c_i$ is the smallest among all other check nodes in $\overline{N}_{s_j}^l \cap N_{proto,s_j}^k$, and where degree of $c_i$ does not exceed the maximum allowable check node degree constrained by a protograph and fixed portions of matrix H 400. If a tie occurs during PEG flow 800, namely there is more than one check node candidate with the same degree, a random selection process may be used to break the tie.

Contrary to conventional PEG flow 600 of FIG. 6, j is defined from m to 3m−1, because submatrix 401 is fixed, so PEG expansion begins in the second column of matrix H 400, such as with submatrix 430. Additionally, as submatrices 402 and 403 are fixed, j beyond 3m−1 is not considered. Furthermore, different starting values for k and different degrees for a variable node are provided for different values of j. Moreover, in contrast to expansion operation at 603, at 812, the candidate check nodes are chosen from $c_i \in N_{proto,s_j}^0$. Additionally, in contrast to expansion operation at 604, at 813, cardinality of the candidate check nodes are chosen from $c_i \in \overline{N}_{s_j}^l \cap N_{proto,s_j}^k$.

After completion of PEG flow 800, a 3m×5m parity check matrix may be obtained, which is denoted as $H_{peg}$. Even though an example of m equal to 100 was used, expansion factor m may be any integer. For example, to obtain a 6144× 10240 parity check matrix, m may be selected as 2048. Of course, these or other values may be used.

At this point, $H_{peg}$ may not contain circulant submatrices. However, use of circulant submatrices may facilitate parallization in hardware for more efficient decoding of LDPC codes in hardware. In order to overcome this drawback, an expansion factor may be split in two multiplicands, $m = m_{PEG} \cdot m_{ACE}$, where $m_{PEG}$ is associated with an above-described PEG flow for ARA codes, and where $m_{ACE}$ is associated with an Approximate Cycle EMD ("ACE") process, where EMD stands for Extrinsic Message Degree, and such ACE process is described below in additional detail. Along those lines, PEG flow 800 may use an expansion factor of $m_{PEG}$. After obtaining $H_{peg}$, a second expansion of factor $m_{ACE}$ may be used, where each zero element of $H_{peg}$ is replaced with an $m_{ACE} \times m_{ACE}$ all-zeros matrix, and where each non-zero element of $H_{peg}$ is replaced with an $m_{ACE} \times m_{ACE}$ circulant matrix. Along those lines, because each non-zero element of $H_{peg}$ is a 1, each such $m_{ACE} \times m_{ACE}$ circulant matrix is a shifted identity matrix. These circulant matrices may be accepted or rejected by an ACE process, which is described below in additional detail. For purposes of clarity, a parity check matrix obtained after PEG processing and ACE processing is denoted as $H_{PEG,ACE}$.

A modified ACE process may be used to maximize connectivity of short cycles in a Tanner Graph instead of or in addition to maximizing girth of such Tanner Graph, as in a PEG process. Thus, to recapitulate, there are three expansions, an expansion factor expansion, a PEG process expansion, and an ACE process expansion. More specifically, an expansion factor expansion may be said to be a product of a PEG process expansion and an ACE process expansion. A modified ACE process expansion may be used to provide circulant submatrices, as a PEG process expansion does not ensure that all PEG expanded submatrices of matrix H 400 are circulant. Furthermore, such modified ACE process expansion is constrained due to fixed submatrices, as previously described. Thus, a PEG expansion factor may be used for a PEG process expansion, and such PEG expansion factor may be less than an ACE expansion factor used for an ACE process.

In an ACE process two parameters which are used are distance $d_{ACE}$ and a connectivity criterion $\eta_{ACE}$. An ACE process sub-optimally attempts to ensure that for all cycles of length less than or equal to $2d_{ACE}$ a connectivity criterion of $\eta_{ACE}$ is met. An ACE process is more connectivity focused than cycle directed, and thus an ACE process is to ensure a minimal connectivity to a subgraph. For purposes of clarity by way of example and not limitation, a modified version of a graph or subgraph to obtain a parity check matrix for a rate of 1/2 AR4A code is described below.

FIG. 9 is a listing depicting an exemplary modified ACE process flow 900. At 901, for an outer do loop, an index i is initialized to equal $m_{PEG}+1$ for all i less than or equal to $5m_{PEG}$, and i is sequentially incremented by 1 (i.e., i++), where $m_{PEG}$ is an expansion constant used for a prior PEG expansion. This second level of expansion provided by ACE flow 900 effectively detects each logic 1 in a submatrix, and expands each such logic 1 with a submatrix with a single logic 1 in each row and column, namely either a diagonal matrix or a shifted diagonal matrix.

An outer do loop of modified ACE process flow 900 begins at 915 and ends at 916. An inner loop nested in such outer loop of ACE process flow 900 begins at 905 and ends at 910. At 902, a redo operation so at 903 each non-zero element in an PEG expanded matrix H 400, namely $H_{PEG}(:, i)$, is replaced with a random $m_{ACE} \times m_{ACE}$ shifted identity matrix, namely a circulant matrix.

At 904, for an inner loop, an index j is initialized to be $(i-1)m_{ACE}+1$ for j less than or equal to $i*m_{ACE}$, and i is incrementally incremented by 1. At 906, ACE detection is performed for a variable node $s_j$. If ACE detection fails as determined at 907, an inner loop is branched out of such loop back to 902. This is done for each variable node of index j.

Before ACE detection is used, parameters $d_{ACE}$ and $\eta_{ACE}$ may be specified. For purposes of clarity by way of example, a rate 1/2 AR4A code example with $d_{ACE}=12$ and $\eta_{ACE}=7$ are used; however, these or other values may be used for these parameters. Furthermore, a function for ACE detection may be defined as follows:

$$ACE(\mu_t) = \begin{cases} d_{\mu_t} - 2 & \text{if } \mu_t \text{ is a variable node} \\ 0 & \text{if } \mu_t \text{ is a check node} \end{cases} \quad (5)$$

For ACE detection for a variable node $s_j$, for an ACE function p, $p(\mu_t) \leftarrow \infty$ for all variable nodes and all check nodes, where $p(\mu_t) \leftarrow ACE(s_j)$.

FIG. 10 is a listing of an exemplary conventional ACE detection flow 1000. ACE detection flow 1000 may be used for ACE detection at 906 of ACE flow 900 of FIG. 9. A variable node $s_j$ is activated for a level 0. As ACE detection flow 1000 is known, it is not described in unnecessary detail herein.

Levels, l, in ACE detection flow 1000 are different from levels 510-$l$ in FIG. 5, as an increment of 1 may result in traversing a graph from variable nodes to check nodes directly incident to such variable nodes, or vice versa. In a PEG process, an increase of level or decrease in depth by an increment of 1 may result in traversing a graph from variable nodes to check nodes directly incident to such variable nodes and then traversing from such check nodes to such variable nodes incident to these check nodes. In some situations, it might not be feasible to keep $d_{ACE}$ constant, and so $d_{ACE}$ may be decremented by 1 until it becomes feasible in such situations.

FIG. 11 is a listing depicting an exemplary parity check matrix 1100. Parity check matrix 1100 is a parity check matrix $H_{PEG,ACE}$ systematically constructed as described herein for circulant matrices of size 128×128 for purposes of clarity by way of example. However, other sizes of circulant matrices may be used.

Figure 12:
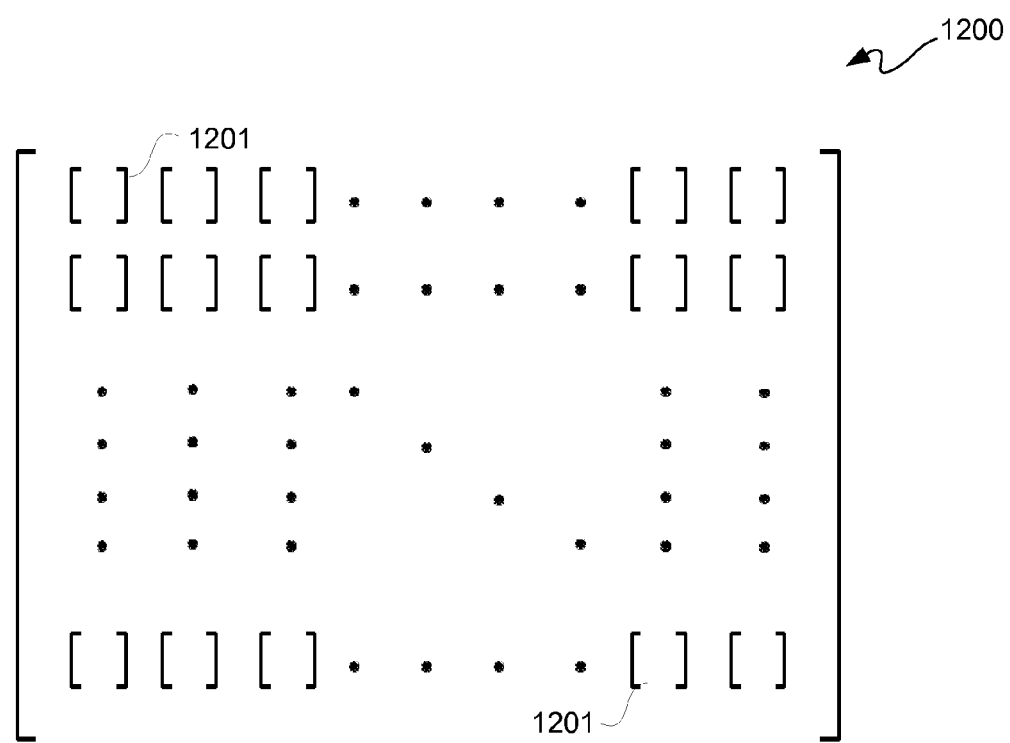
FIG. 12 is a matrix diagram depicting an exemplary optionally expressed parity check matrix for the parity check matrix of FIG. 11 having circulant submatrices.

FIG. 12 is a matrix diagram depicting an exemplary parity check matrix 1200 for parity check matrix 1100 of FIG. 11 having circulant submatrices. Parity check matrix 1200 has multiple instances of 128×128 circulant submatrices 1201 to form a 6,144 by 10,240 parity check matrix 1200. Again, specific numbers are used for purposes of clarity by way of example and not limitation. This means that parity check matrix 1200 has 6,144 check nodes and 10,240 variable nodes. Of these variable nodes, 2048 of such variable nodes are punctured, which means that of these variable nodes only 8192 of them are transmitted through a communications channel. For this example, PEG expansion size or factor is 16; an ACE expansion size or factor is 128, which is the same size as circulant matrices 1201; and an input block length is 4096.

Parity check matrix 1200, which consists of circulant matrices 1201 of size 128 by 128 can be represented concisely by the phases of circulant matrices 1201. Circulant matrices 1201 within parity check matrix 1200 are one of two types of matrices, namely all-zero matrices or shifted identity matrices, and both of these types of matrices or submatrices exist in parity check matrix 1200. Along those lines, some of such matrices may be unshifted and some such matrices may be shifted; however, unshifted matrices are identity matrices which may be circularly shifted. But we consider the unshifted ones a subset of the shifted identity matrices. For purposes of clarity and not limitation, for the following description a circulant shift refers to a left to right shift with respect to a 128×128 submatrix.

Each row in parity check matrix 1200 provides information on 128 check nodes due as parity check matrix 1200 includes circulant submatrices 1201. For example, a first check node equation for a first row 1101 in parity check matrix 1100 may be written as:

$$c_1 = v_1 \oplus v_{4188} \quad (6a)$$

where variable nodes $v_1$ and $v_{4188}$ are XORed to provide a value for a first check node $c_1$. A second check node equation of parity check matrix 1100 may be obtained by circularly shifting Equation (6a) for check node $c_1$ to obtain a value for a second check node as:

$$c_2 = v_2 \oplus v_{4189} \quad (6b)$$

Check node equations 3 through 128 may likewise be obtained by continuing to incrementally and sequentially circulantly shift each prior equation, such that for example:

$$c_3 = v_3 \oplus v_{4190} \quad (6c)$$

and $$c_{128} = v_{128} \oplus v_{4187} \quad (6d)$$

A check node equation 129 for parity check matrix 1100 corresponds to a second row thereof, namely row 1102.

$$c_{129} = v_{129} \oplus v_{4099} \oplus v_{4330} \quad (7a)$$

Check node equations 130 through 256 may be obtained by sequentially by 1 circulantly shifting starting from check node equation 129, namely Equation (7a), as follows:

$$c_{130} = v_{130} \oplus v_{4100} \oplus v_{4331} \quad (7b)$$

$$c_{131} = v_{131} \oplus v_{4101} \oplus v_{4332} \quad (7c)$$

and so on, $$c_{256} = v_{256} \oplus v_{4098} \oplus v_{4329} \quad (7d)$$

The above-described row by row approach may be used to determine all remaining check node equations, up to check node equation 6,144, which would be:

$$c_{6144} = v_{2148} \oplus v_{2699} \oplus v_{4078} \oplus v_{4627} \oplus v_{10106} \oplus v_{10127} \quad (8)$$

Additionally, parity check matrix 1100 may be more simply represented for purposes of a less complex implementation by indexing which of the 80 submatrices in each row are active, i.e., which of them are not all zero matrices. Along those lines, phase of a shift in an active submatrix may be specified by a column in the first row which is equal to 1.

FIG. 13 is a listing depicting an exemplary parity check matrix 1300. Parity check matrix 1300 is a parity check matrix $H_{PEG,ACE}$ systematically constructed as described herein for circulant matrices of size 128×128 for purposes of clarity by way of example and is optionally expressed with respect to parity check matrix 1100 of FIG. 11.

However, other sizes of circulant matrices may be used. In this example depiction, elements (i,j) in each row represent an index of an active submatrix and a column in a first row of such submatrix which equals 1. More particular, each i represents the index of an active submatrix, and each j represents a column in the first row of such $i^{th}$ submatrix which is equal to 1.

To recapitulate, AR4A codes can be encoded using two accumulators, two repetition coders ("repeaters"), two input index filters, an output index filter, and a permuter. A parity check matrix $H_{PEG,ACE}$ may be systematically constructed to possess such encoder structure, and AR4A codes may be encoded by using an $H_{PEG,ACE}$ resultant parity check matrix. A resultant parity check matrix $H_{PEG,ACE}$ has limits on how many logic 1s may be in columns and rows in such final parity check matrix and has a structure such that each non-zero submatrix is an identity matrix or a shifted identity matrix. Encoding using such a finally constructed parity check matrix is described below in additional detail.

Along those lines, $H_{PEG,ACE}$ may be a 3m×5m parity-check matrix, namely there are 5m variable nodes and 3m check nodes in a Tanner Graph representation of such parity check matrix. However, out of the 5m variable nodes, only 4m of such variable nodes ("information variable nodes") may be transmitted through a communications channel as associated with information bits, whereas the remaining m variable nodes ("punctured variable nodes") are for punctured bits, and so they need not be transmitted through such communications channel. Of the 4m information variable nodes to be transmitted, a first 2m of such variable nodes may be information bits. In a parity check matrix, such first 2m of such variable nodes simply correspond to the first 2m variable nodes, as so they may be passed along without encoding. These information bits may be directly assigned to the first 2m variable nodes, and then such information bits may be encoded to the remaining variable nodes. Variable nodes 2m+1 to 3m, which correspond to columns starting from 2m+1 to 3m in a parity check matrix, may be punctured variable nodes, and so these variable nodes do not need to be transmitted. Nonetheless, these 2m+1 to 3m punctured variable nodes are determined, such as computed or otherwise encoded, in order to encode the last 2m of the 5m variable nodes.

FIG. 14 is a listing depicting an exemplary punctured variable nodes encoding flow 1400. Encoding flow 1400 may be used to encode all punctured variable nodes.

At 1401, an index i is initialized from 2m+1 to 3m to cover a range of punctured variable nodes in a parity check matrix. At 1415, an outer do loop begins, and at 1416, such outer do loop ends. At 1402, an index j is initialized from 1 to m to process each punctured variable node in such 2m punctured variable nodes. At 1425, an inner do loop, nested in such outer do loop, begins, and at 1426, such inner do loop ends.

At 1403, it is determined whether $(H_{j,i}=1)$ & $(H_{j,2m+1:i-1}=\underline{0})$, which means a corresponding variable node belongs to the first row of accumulator structure 700 of FIG. 7. If 1403 is true, then at 1404 $s_{i-1}$ is set equal to $s_{j-1}$, or $s_{i-1}=s_{j-1}$, in order to satisfy the parity equation. If, however, 1403 is false, then at 1405 it is determined whether $(H_{j,i}=1)$ & $(H_{j,k}=1, k\epsilon[2m+1,i-1])$, which means a corresponding variable node belongs to any row in accumulator structure 700 except the first row. If 1405 is true, then at 1406 $s_{i-1}$ is set equal to a result of an XORing of $s_{j-1}$ and $s_{k-1}$, or $s_{i-1}=s_{j-1}\oplus s_{k-1}$, in order to satisfy the parity equation.

After such 2m+1 to 3m punctured variable nodes are determined, a last 2m variable nodes of such 5m variable nodes may be encoded, as indicated in FIG. 15.

FIG. 15 is a listing depicting an exemplary variable nodes encoding flow 1500. Encoding flow 1500 may be used to encode a last 2m variable nodes of the 5m variable nodes of a parity check matrix.

At 1501, an index i is initialized from 3m+1 to 5m to cover a range of the last 2m variable nodes in a parity check matrix. At 1515, an outer do loop begins, and at 1516, such outer do loop ends. At 1502, an index j is initialized from m+1 to 3m to process each variable node in such last 2m variable nodes. At 1525, an inner do loop, nested in such outer do loop, begins, and at 1526, such inner do loop ends.

At 1503, it is determined whether $(H_{j,i}=1)$ & $(H_{j,3m+1:i-1}=\underline{0})$, which means a corresponding variable node belongs to the first row of accumulator structure 700 of FIG. 7. If 1503 is true, then at 1504 $s_{i-1}$ is set as follows: $s_{i-1}=$ mod $(H_{(j,1:3m)}\cdot \underline{s}_{0:3m-1},2)$, in order to satisfy the parity equation. If, however, 1503 is false, then at 1505 it is determined whether $(H_{j,i}=1)$ & $(H_{j,k}=1, k\epsilon[3m+1,i-1])$, which means a corresponding variable node belongs to any row in accumulator structure 700 except the first row. If 1505 is true, then at 1506 $s_{i-1}$ is set as follows $s_{i-1}=$mod$(H_{(j,1:i-1)}\cdot \underline{s}_{0:i-2},2)$, in order to satisfy the parity equation.

In the above description, ARA code encoding has been described, including generation of a parity check matrix from an encoder model for ARA code encoding. Such parity check matrix generation and ARA code encoding has been described without reference to a "tail biting" accumulator. The following description includes modification of the above description to include "tail biting" accumulator for precoding. Thus, in the following description, accumulator or precoder is configured as a tail biting accumulator in accordance with FIG. 16.

FIG. 16 is a matrix diagram depicting an exemplary tail biting accumulator structure 1600. Tail biting accumulator structure 1600 is similar to accumulator structure 700 of FIG. 7, except for inclusion of a tail biting bit, namely a logic 1 tail biting bit 1601. Tail biting bit 1601 replaces a logic 0 with a logic 1 in an uppermost and rightmost corner of matrix $H_2$ 402.

The addition of tail biting bit 1601 may result in significant protection improvement for the last variable node in a parity check matrix, or more particularly matrix $H_2$ 402, and as such may also turn out to be the last variable ace_exp of many variable nodes. This may increase error correcting capability for obtaining improved signal-to-noise ratios ("SNRs"). Additionally, inclusion of tail biting bit 1601 may lower the error floor.

FIG. 17 is a listing depicting an exemplary punctured variable nodes encoding flow 1700 for encoding with a tail biting bit, such as in tail biting accumulator structure 1600 of FIG. 16. FIG. 18 is a listing depicting an exemplary variable nodes encoding flow 1800 for tail biting. Encoding flow 1800 may be used to encode a last 2m variable nodes of the 5m variable nodes of a parity check matrix with tail biting. With simultaneous reference to FIGS. 14 through 18, encoding flows 1700 and 1800 are further described.

Encoding flow 1700, like encoding flow 1400 of FIG. 14, may be used to encode all punctured variable nodes. When constructing a parity check matrix for use of tail biting, PEG and ACE process as described with reference to FIGS. 8 and 9 are the same as for a non-tail-biting application. However, encoding is modified for tail-biting AR4A codes. Thus, though encoding flows 1400 and 1500 are respectively similar to encoding flows 1700 and 1800, there are differences as indicated below.

When tail-biting is used, $H_{PEG,ACE}$ may be a 3m×(5m+ace_exp) parity-check matrix. Accordingly, there are 5m+ace_exp variable nodes and 3m check nodes in a Tanner Graph representation, where ace_exp denotes a size of an ACE expansion, or ace expansion ("exp")" size. Consistent with the above description regarding encoding for a non-tail biting configuration, out of 5m+ace_exp variable nodes, only 4m+ace_exp of such variable nodes are transmitted through a communications channel. Along those lines, m variable nodes are punctured bits, and so such punctured variable nodes need not be transmitted through such communication channel. Of the transmitted 4m+ace_exp variable nodes, a first m−ace_exp variable nodes, as well as variable nodes 3m−ace_exp+1 through 3m, are information bits. Variable nodes 2m+1 to 3m are punctured variable nodes, as before, and so such punctured variable nodes need not be transmitted. Nonetheless, such punctured variable nodes are encoded, such as computed or otherwise determined, in order to encode the last 2m+ace_exp variable nodes of such 5m variable nodes of a parity check matrix.

At 1701, an index i is initialized from i=2m+1 to 2m+ace_exp to cover a first portion of a punctured variable nodes in a parity check matrix. At 1715, a first outer do loop begins, and at 1716, such first outer do loop ends. At 1402, an index j is initialized from 1 to m to process each punctured variable node in such first portion of punctured variable nodes. At 1725, a first inner do loop, nested in such first outer do loop, begins, and at 1726, such first inner do loop ends.

At 1703, it is determined whether $(H_{j,i}=1)$ & $(H_{j,2m+1:i}=\underline{0})$, which is similar to 1403 for determining $(H_{j,i}=1)$ & $(H_{j,2m+1:i-1}=\underline{0})$. If 1703 is true, then at 1404 $s_{i-1}$ is set equal to $s_{j-1}$, or $s_{i-1}=s_{j-1}$. If, however, 1703 is false, then a next j is processed.

At 1711, an index i is initialized from i=2m+ace_exp+1 to 3m−ace_exp to cover a second portion of punctured variable nodes in a parity check matrix. At 1735, a second outer do loop begins, and at 1736, such second outer do loop ends. At 1402, an index j is initialized from 1 to m to process each punctured variable node. At 1745, a second inner do loop, nested in such second outer do loop, begins, and at 1746, such second inner do loop ends. At 1405 it is determined whether $(H_{j,i}=1)$ & $(H_{j,k}=1, k\in[2m+1,i-1])$. If 1405 is true, then at 1406 $s_{i-1}$ is set equal to a result of an XORing of $s_{j-1}$, and $s_{k-1}$, or $s_{i-1}=s_{j-1}\oplus s_{k-1}$. If, however, 1405 is false, then a next j is processed.

At 1751, an index i is initialized from i=m−ace_exp+1 to m, to cover a third portion of such punctured variable nodes in a parity check matrix. At 1755, a last or third outer do loop begins, and such last or third outer do loop ends at 1756. For each such i, at 1752 a variable node is set as follows:

$$s_{i-1}=mod(H_{(j,m+1:end)}\cdot \underline{s}_{m:end},2).$$

Three separate sets of indices i at 1701, 1711, and 1751 are for taking into account the different encoding procedures used for variable nodes that belong to different submatrices, such as for example submatrices 401, 402, 421, and 422. After all such punctured variable nodes are determined, a last 2m+ace_exp variable nodes of such 5m+ace_exp variable nodes may be encoded, as indicated in FIG. 18. At 1799, a variable node is set to zero, namely $s_{5m-ace\_exp:5m-1}=\underline{0}$. This is to ensure that the parity equations are satisfied.

At 1801, an index i is initialized from 3m+1 to 3m+ace_exp to cover a first portion of the last 2m+ace_exp variable nodes in a parity check matrix. At 1815, a first outer do loop begins, and at 1816, such first outer do loop ends. At 1502, an index j is initialized from m+1 to 3m to process each variable node in such first portion of variable nodes. At 1825, a first inner do loop, nested in such first outer do loop, begins, and at 1826, such first inner do loop ends.

At 1503, it is determined whether $(H_{j,i}=1)$ & $(H_{j,3m+1:i-1}=\underline{0})$. If 1503 is true, then at 1504 $s_{i-1}$ is set as follows: $s_{i-1}=mod(H_{(j,1:3m)}\cdot \underline{s}_{0:3m-1},2)$. If, however, 1503 is false, then a next j is processed.

At 1811, an index i is initialized as i=3m+ace_exp+1 to 5m−ace_exp to cover a second portion of the last 2m+ace_exp variable nodes in a parity check matrix. At 1835, a second outer do loop begins, and at 1836, such second outer do loop ends. At 1502, an index j is initialized from m+1 to 3m to process each variable node in such second portion of variable nodes. At 1845, a second inner do loop, nested in such second outer do loop, begins, and at 1846, such second inner do loop ends.

At 1505 it is determined whether $(H_{j,i}=1)$ & $(H_{j,k}=1, k\in[3m+1,i-1])$. If 1505 is true, then at 1806 $s_{i-1}$ is set as follows $s_{i-1}=mod(H_{(i-2m-ace\_exp,1:i-1)}\cdot \underline{s}_{0:i-2},2)$. If, however, 1505 is false, then a next j is processed.

At 1851, an index i is initialized from i=5m+1 to 5m+ace_exp, to cover a third portion of the last 2m+ace_exp variable nodes in a parity check matrix. At 1855, a last or third outer do loop begins, and such last or third outer do loop ends at 1856. For each such i, at 1852 a variable node is set as follows:

$$s_{i-1}=mod(H_{(j,1:i-1)}\cdot \underline{s}_{0:i-2},2).$$

Figure 19:
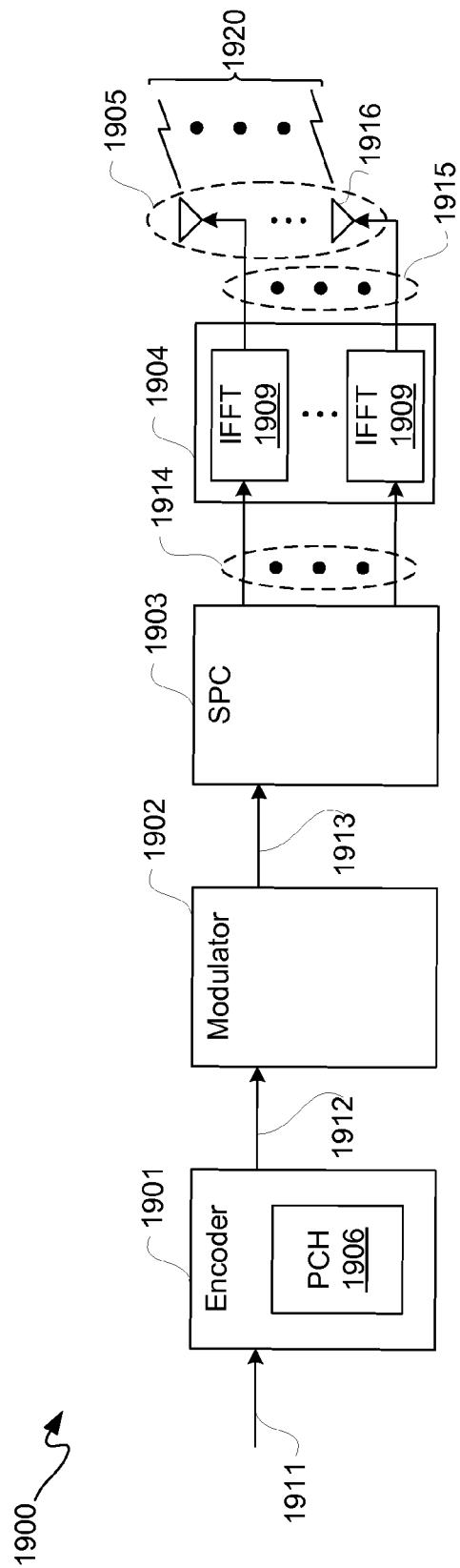
FIG. 19 is a block diagram depicting an exemplary transmitter system.

FIG. 19 is a block diagram depicting an exemplary transmitter system 1900. Transmitter system 1900 includes a coder, such as encoder 1901 for example, as well as a modulator 1902, a serial-to-parallel converter ("SPC") 1903, an array of transmitters 1904, and an array of antennas 1905. Encoder 1901, which may be an LDPC encoder, may be coupled to receive information bits 1911. Encoder 1901 may include a parity check matrix block ("PCH") 1906. In an embodiment, PCH 1906 may be instantiated using programmable fabric resources of FPGA 100. In another embodiment, PCH 1906 may be instantiated using programmable digital signal processing blocks of FPGA 100. However, other hardware configurations of PCH 1906 may be used. PCH 1906 may be a parity check matrix as describe elsewhere herein for using an AR4A code for example.

Encoder 1901 may be configured to encode information bits 1911 using a stored parity check matrix of PCH 1906 to provide encoded information, such as coded bits 1912 or other coded information, which may include information bits as well as parity bits, to modulator 1902. Modulator 1902 may be a phase-shift keying ("PSK") modulator or other type of modulator. Modulator 1902 may be configured to modulate coded bits 1912 to provided coded symbols 1913.

SPC 1903 may be coupled to receive coded symbols 1913 to convert each single stream of coded symbols 1913 received into multiple streams 1914 which may be provided in parallel. SPC 1903 may be a serializer-deserialer ("SERDES") of FPGA 100.

Array of transmitters 1904 may be coupled to receive multiple streams 1914. More particularly, Inverse Fast Fourier Transform ("IFFT") blocks 1909 of array of transmitters 1904 may be respectively coupled to receive multiple streams 1914. Outputs 1915 from IFFT blocks 1909 may be respectively coupled to transmission antennas 1916 of array of antennas 1905 for transmission of information via one or more communication channels 1920.

Figures 20, 21:
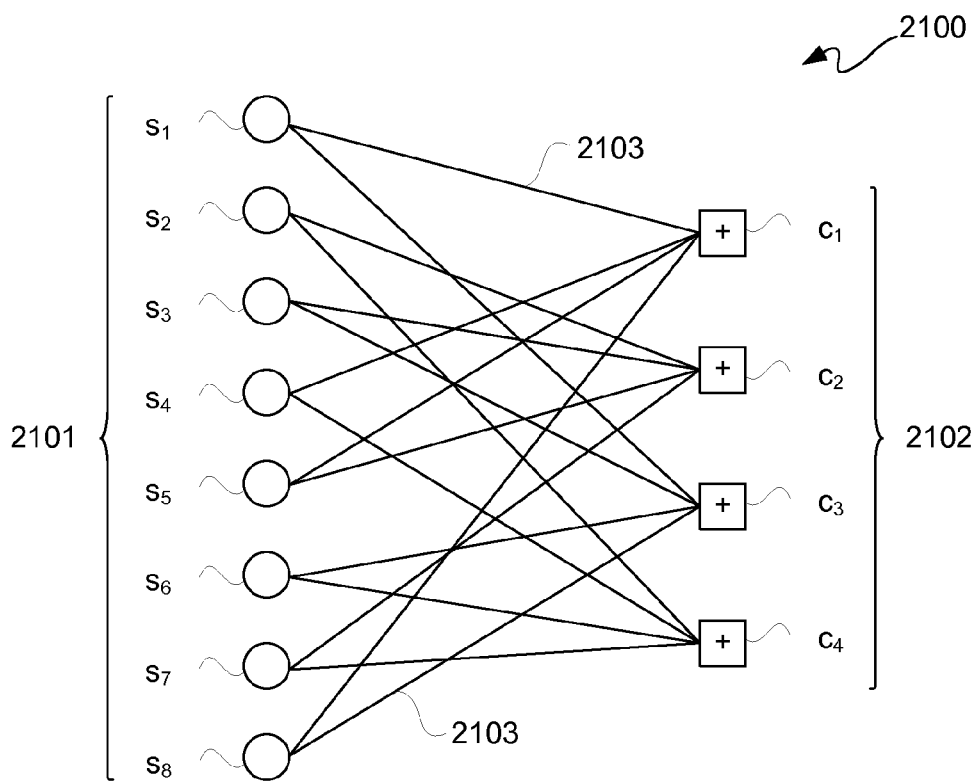
FIG. 20 is a matrix diagram depicting another exemplary parity check matrix.
FIG. 21 is a bigraph diagram depicting an exemplary bipartite graph for the parity check matrix of FIG. 20.

LDPC codes are linear block codes with sparse parity check matrices $H_{(N-K)\times N}$, with N variable nodes and N−K check nodes. FIG. 20 is a matrix diagram depicting an exemplary parity check matrix 2000. In this example, an LDPC code of length N=8 and rate 1/2 is represented with parity check matrix 2000.

FIG. 21 is a bigraph diagram depicting an exemplary bipartite graph 2100 for parity check matrix 2000 of FIG. 20. In this example, there are eight variable nodes 2101 and four check nodes 2102. Along those lines, lines 2103 indicate connectivity between each check node equation and corresponding variable nodes.

In order to determine the value of each element in a codeword, variable nodes 2101 and check nodes 2102 communicate with each other iteratively. This iterative approach to decoding is commonly referred as a "message passing" process. A parity check matrix for an AR4A code, as described elsewhere herein, may be used for decoding using a "message passing" process, as described below in additional detail.

In such a message passing process, variable nodes s from n to $k_i$ may be mathematically expressed as $s_{n \to k_i} = u_n$, n=0, 1, ..., N−1, i=1, 2, ..., $d_{s_n}$, where: $s_{n \to k_i}$ denotes a message that variable node f transmits to its adjacent check node $k_i$; $u_n$ denotes a channel log-likelihood ratio ("LLR") for variable node n; N is the size of a codeword; and where $d_{s_n}$ is the degree of $s_n$.

Figure 22:
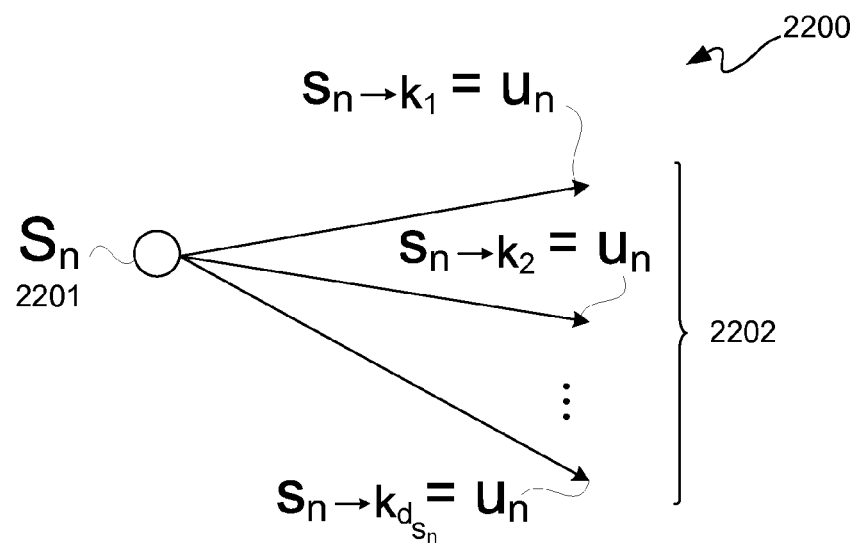
FIG. 22 is a vector diagram depicting an exemplary message passing initialization.

FIG. 22 is a vector diagram depicting an exemplary message passing initialization 2200. A variable node $s_n$ 2201 has multiple connections or vectors extending therefrom toward corresponding check nodes. Thus, vectors 2202 represent outgoing messages 2202 from a variable node $s_n$ 2201, and such initialization may be performed for each variable node $s_n$ 2201. Outgoing messages 2202 may be for a variable node $s_n$ 2201 for each corresponding check node $c_k$ for n approaching $k_i$ for i from 1 to $d_{s_n}$, and such outgoing messages 2202 may be initialized for each variable node $s_n$ 2201.

Decoding AR4A codes is identical to decoding LDPC codes after initialization. However, during or as part of initialization, channel information, which may be provided as LLRs, of punctured variable nodes are set to zero and kept at zero throughout decoding. Thus, for example, LLRs for all punctured variable nodes, as described above, are set to zero. Recall, punctured variable nodes are not transmitted. Thus, for purposes of clarity and not limitation, transmitted variable nodes are hereinafter referred to as decision variable nodes.

Figure 23:
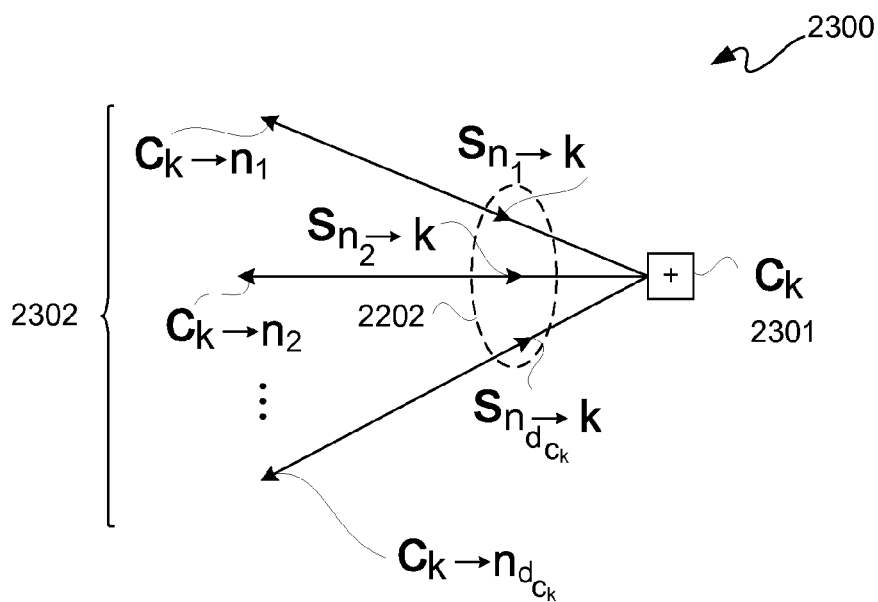
FIG. 23 is a vector diagram depicting an exemplary message passing back from a check node to corresponding decision variable nodes.

FIG. 23 is a vector diagram depicting an exemplary message passing back from a check node 2301 to corresponding decision variable nodes 2201. In FIG. 23, outgoing messages 2202 from a decision variable node are incoming messages 2202 with respect to a check node $c_k$ 2301. Incoming messages 2202 to a check node $c_k$ 2301 may be from such check node's $d_{c_k}$ adjacent variable nodes, which may be denoted as $$s_{n_1 \to k}, s_{n_2 \to k}, \ldots, s_{n_{d_{c_k}} \to k}.$$

Outgoing messages 2302 from a check node $c_k$ 2301 back to $d_{c_k}$ adjacent variable nodes 2201 may be determined, such as calculated or otherwise determined, and may be denoted as $$c_{k \to n_1}, c_{k \to n_2}, \ldots, c_{k \to n_{d_{c_k}}}.$$

Such check nodes $c_k$ 2301 may be updated, which updating may be mathematically expressed as follows:

$$c_{k \to n_i} = g\left(s_{n_1 \to k}, s_{n_2 \to k}, \ldots, s_{n_{i-1} \to k}, s_{n_{i+1} \to k}, \ldots, s_{n_{d_{c_k}}}\right). \quad (9a)$$

In Equation (9a), each check node $c_k$ 2301 may be updated in accordance with a function g, which function g may be a function of a and b, where:

$$g(a,b) = \text{sign}(a) \times \text{sign}(b) \times \min(|a|,|b|) + \text{LUT}_g(a,b). \quad (9b)$$

In Equation (9b), lookup tables ("LUTs") may be assigned for performing value lookups responsive to values for a and b in a function g. Such LUTs may be provided using dedicated hardware or may be provided using CLBs or other programmable resources of programmable fabric of FPGA 100. Values may be predetermined and stored in LUTs for such lookups. Along those lines, values to be stored in such LUTs for various values of a and b may be predetermined using Equation (9c):

$$\text{LUT}_g(a,b) = \log(1 + e^{-|a+b|}) - \log(1 + e^{-|a-b|}). \quad (9c)$$

Figure 24:
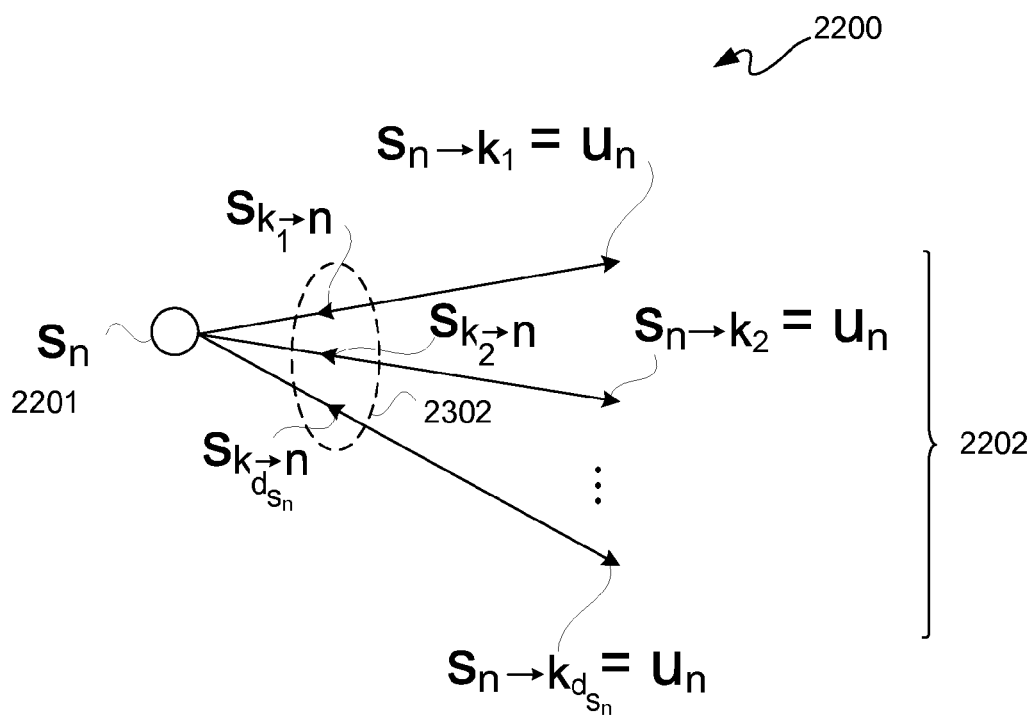
FIG. 24 is a vector diagram depicting an exemplary message passing back from a decision variable node to corresponding check nodes.

In addition to updating check nodes, variable nodes are updated. FIG. 24 is a vector diagram depicting an exemplary message passing back from a decision variable node 2201 to corresponding check nodes. In FIG. 24, outgoing messages 2302 from a check node 2301 are incoming messages 2302 with respect to a decision variable node $s_n$ 2201. Incoming messages 2302 to a decision variable node $s_n$ 2201 from such variable node's $d_{s_n}$ adjacent check nodes are denoted as $$c_{k_1 \to n}, c_{k_2 \to n}, \ldots, c_{k_{d_{s_n}} \to n}.$$

Outgoing messages 2202 from a decision variable node $s_n$ 2201 back to $d_{s_n}$ adjacent check nodes 2301 may be determined, such as calculated or otherwise determined, and may be denoted as $$c_{k_1 \to n}, c_{k_2 \to n}, \ldots, c_{k_{d_{s_n}} \to n}.$$

Such decision variable nodes sn 2201 may be updated, which updating may be mathematically expressed as follows:

$$S_{n \to k_i} = u_n + \sum_{j \neq i} c_{k_j \to n}. \quad (10a)$$

Decision variable nodes, such as in contrast to punctured variable nodes, may be updated after each iteration. For example, a decision variable node $c_n$ may have a value $d_{c_n}$, which value may be updated after each iteration according to:

$$d_{c_n} + u_n + \Sigma c_{k_j \to n}. \quad (10b)$$

A decision on $c_n$ may be made according to the following rule:

$$c_n = \begin{cases} 0 & \text{if } d_{c_n} > 0 \\ 1 & \text{otherwise} \end{cases}. \quad (10c)$$

Thus, such decoding decision for decision variable nodes is to set such decision variable node to 0 if its value, or more particularly updated log likelihood ratio, is greater than zero and to set such decision variable node to a 1 in all other instances. Along those lines, d subscript $c_n$ in Equation (10c) should not be confused with the degree of a variable node.

Figure 25:
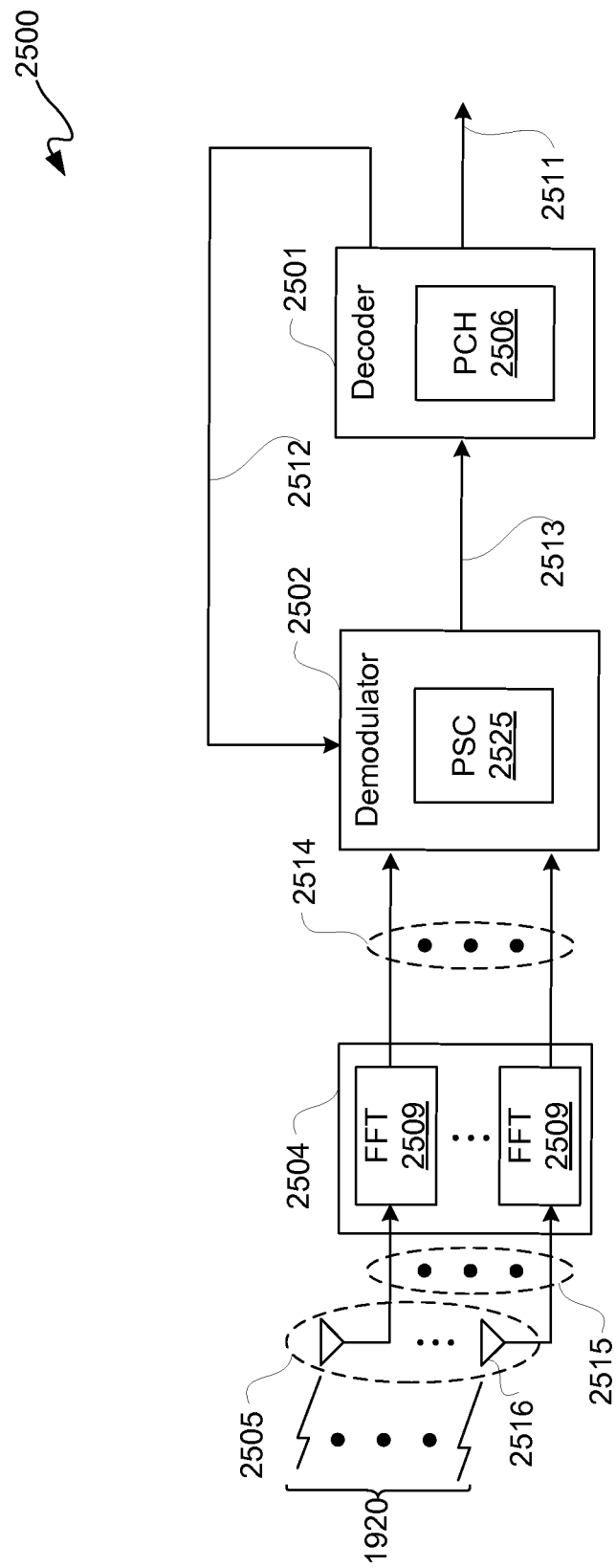
FIG. 25 is a block diagram depicting an exemplary receiver system.
Figures 4, 29:
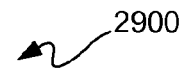

FIG. 25 is a block diagram depicting an exemplary receiver system 2500. Receiver system 2500 includes a coder, such as decoder 2501 for example, as well as decoder 2501, a demodulator 2502, an array of receivers 2504, and an array of antennas 2505. One or more communications channels 1920 may be coupled to one or more antennas 2516 of array of antennas 2505.

Array of receivers 2504 may be coupled to receive multiple streams of incoming information. More particularly, Fast Fourier Transform ("FFT") blocks 2509 of array of receivers 2504 may be respectively coupled to receive multiple incoming streams 2515. Outputs 2514 respectively from FFT blocks 2509 may be coupled to demodulator 2502.

For purposes of clarity and not limitation, it shall be assumed that demodulator 2502 is a soft demodulator and that decoder 2501 is a soft decoder in keeping with the above description of using LLRs. However, in other configurations, a hard demodulator and/or a hard decoder may be used. Generally, for example, a hard decoder treats all bits separately, and may use a Hamming metric to determine which bit was sent based on a sequence of bits. Recall, for AR4A, bits are repeated four times for encoding. Generally, for example, a soft decoder, does not make a decision on each bit, but may sum up bit values for a sequence, and may use a Euclidean approach to determine which bit such sequence of bits is closest to. Both hard and soft decoders may make decisions using a Maximum Likelihood principle.

Demodulator 2502 may include a parallel-to-serial converter ("PSC") 2525 to provide a demodulated output 2513 responsive to received outputs 2514 from FFT blocks 2509. Decoder 2501, which may be an LDPC decoder as described above to perform message passing with punctured variable nodes all set to zero, may be coupled to receive demodulated output 2513.

Decoder 2501 may include a stored parity check matrix of PCH 2506 as described elsewhere herein for decoding an AR4A code. Using such PCH 2506, decoder 2501 may output decoded information or information for decoding ("coded information"), such as information bits decisions 2511. Moreover, an output of decoder 2501 may be provided as feedback 2512 to demodulator 2502 for Turbo iterative demodulation and decoding.

PCH 2506, as well as PCH 1906 of FIG. 19, may be constructed starting from matrix H 400 of FIG. 4. Such PCHs may be built up with an $m_{peg}$ expansion followed by an $m_{ace}$ expansion, examples for both of which are described herein.

FIGS. 26 through 41-2 are multiple listings depicting respective exemplary parity check matrices associated with Tanner Graph representations of ARA4 codes without tail biting. As previously described, parity check matrix 1100 of FIG. 11 may optionally be expressed as parity check matrix 1300 of FIG. 13. Parity check matrices 1100 and 1300 are for a PEG expansion equal to 16, an ACE expansion equal to 128, and an input block length of 4096; however, other forms of parity check matrices including their optional expressions may be used. Furthermore, as parity check matrices 1100 and 1300 are for ARA4 codes, as well as the following described parity check matrices, it should be appreciated that an ARA4 code, like other block codes, may be defined for an input block length.

FIGS. 26 and 27 are respectively for parity check matrix 2600 and its optionally expressed parity check matrix 2700 each of which is for a PEG expansion equal to 32, an ACE expansion equal to 64, and an input block length of 4096.

FIGS. 28-1 through 28-4 (collectively FIG. 28) and FIGS. 29-1 through 29-4 (collectively FIG. 29) are respectively for parity check matrix 2800 and its optionally expressed parity check matrix 2900 each of which is for a PEG expansion equal to 48, an ACE expansion equal to 64, and an input block length of 6144.

FIGS. 30-1 through 30-4 (collectively FIG. 30) and FIGS. 31-1 through 31-4 (collectively FIG. 31) are respectively for parity check matrix 3000 and its optionally expressed parity check matrix 3100 each of which is for a PEG expansion equal to 64, an ACE expansion equal to 64, and an input block length of 8192.

Figures 2, 32:
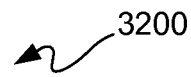

FIGS. 32-1 and 32-2 (collectively FIG. 32) and FIGS. 33-1 and 33-2 (collectively FIG. 33) are respectively for parity check matrix 3200 and its optionally expressed parity check matrix 3300 each of which is for a PEG expansion equal to 20, an ACE expansion equal to 100, and input block length 4000.

FIGS. 34-1 and 34-2 (collectively FIG. 34) and FIGS. 35-1 and 35-2 (collectively FIG. 35) are respectively for parity check matrix 3400 and its optionally expressed parity check matrix 3500 each of which is for a PEG expansion equal to 31, an ACE expansion equal to 100, and an input block length of 6200.

Figures 3, 36:
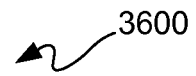

FIGS. 36-1 through 36-3 (collectively FIG. 36) and FIGS. 37-1 through 37-3 (collectively FIG. 37) are respectively for parity check matrix 3600 and its optionally expressed parity check matrix 3700 each of which is for a PEG expansion equal to 41, an ACE expansion equal to 100, and an input block length of 8200.

FIGS. 38-1 and 38-2 (collectively FIG. 38) and FIGS. 39-1 and 39-2 (collectively FIG. 39) are respectively for parity check matrix 3800 and its optionally expressed parity check matrix 3900 each of which is for a PEG expansion equal to 24, an ACE expansion equal to 128, and an input block length of 6144.

Figures 1, 40:

FIGS. 40-1 and 40-2 (collectively FIG. 40) and FIGS. 41-1 and 41-2 (collectively FIG. 41) are respectively for parity check matrix 4000 and its optionally expressed parity check matrix 4100 each of which is for a PEG expansion equal to 32, an ACE expansion equal to 128, and an input block length of 8192.

FIGS. 42-1 through 59-2 are multiple listings depicting respective exemplary parity check matrices associated with Tanner Graph representations of ARA4 codes with tail biting.

FIGS. 42-1 and 42-2 (collectively FIG. 42) and FIGS. 43-1 and 43-2 (collectively FIG. 43) are respectively for parity check matrix 4200 and its optionally expressed parity check matrix 4300 each of which is for a PEG expansion of 32, an ACE expansion of 64, and an input block length of 4096.

FIGS. 44-1 through 44-3 (collectively FIG. 44) and FIGS. 45-1 through 45-3 (collectively FIG. 45) are respectively for parity check matrix 4400 and its optionally expressed parity check matrix 4500 each of which is for a PEG expansion of 48, an ACE expansion of 64, and an input block length of 6144.

FIGS. 46-1 through 46-4 (collectively FIG. 46) and FIGS. 47-1 through 47-4 (collectively FIG. 47) are respectively for parity check matrix 4600 and its optionally expressed parity check matrix 4700 each of which is for a PEG expansion of 64, an ACE expansion of 64, and an input block length of 8192.

Figures 1, 48:
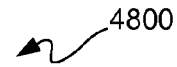

FIGS. 48-1 and 48-2 (collectively FIG. 48) and FIGS. 49-1 and 49-2 (collectively FIG. 49) are respectively for parity check matrix 4800 and its optionally expressed parity check matrix 4900 each of which is for a PEG expansion of 20, an ACE expansion of 100, and an input block length of 4000.

FIGS. 50-1 and 50-2 (collectively FIG. 50) and FIGS. 51-1 and 51-2 (collectively FIG. 51) are respectively for parity check matrix 5000 and its optionally expressed parity check matrix 5100 each of which is for a PEG expansion of 31, an ACE expansion of 100, and an input block length of 6200.

Figures 3, 52:

FIGS. 52-1 through 52-3 (collectively FIG. 52) and FIGS. 53-1 through 53-3 (collectively FIG. 53) are respectively for parity check matrix 5200 and its optionally expressed parity check matrix 5300 each of which is for a PEG expansion of 41, an ACE expansion of 100, and an input block length of 8200.

FIGS. 54 and 55 are respectively for parity check matrix 5400 and its optionally expressed parity check matrix 5500 each of which is for a PEG expansion of 16, an ACE expansion of 128, and an input block length of 4096.

FIGS. 56-1 and 56-2 (collectively FIG. 56) and FIGS. 57-1 and 57-2 (collectively FIG. 57) are respectively for parity check matrix 5600 and its optionally expressed parity check matrix 5700 each of which is for a PEG expansion of 24, an ACE expansion of 128, and an input block length of 6144.

FIGS. 58-1 and 58-2 (collectively FIG. 58) and FIGS. 59-1 and 59-2 (collectively FIG. 59) are respectively for parity check matrix 5800 and its optionally expressed parity check matrix 5900 each of which is for a PEG expansion of 32, an ACE expansion of 128, and an input block length of 8192.

The above-described specific sets of parity check matrices are each unique. Though specific examples of such parity matrices are described, it should be understood that these or any other parity matrices may result by applying processes described herein in such order as described herein. Along those lines, such parity matrices may thus be generated for any of a variety of ARA codes.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
    at least one coder block having a parity check matrix;
    wherein the parity check matrix comprises each element of an H matrix expanded by a Progressive Edge Growth ("PEG") expansion factor and an Approximate Cycle Extrinsic Message Degree ("ACE") expansion factor;
    wherein the parity check matrix is for an accumulate-repeat-accumulate ("ARA") code and is associated with an input block length;
    wherein the at least one coder block is configured for executing a modified PEG process;
    wherein the at least one coder block is configured to have:
        each of variable nodes $s_j$ of the parity check matrix defined from m to 3m−1 for j;
        different starting values for connectivity k and different degrees for each of the variable nodes $s_j$ for different values of j;
        candidate check nodes from $c_i \in N_{proto,s_j}^0$ for set N of a protograph, wherein the protograph represented by the H matrix includes an m×m $H_1$ submatrix, an m×m $H_2$ submatrix, and $H_3$ submatrix each of which is a fixed matrix, the m×m $H_1$ submatrix being an identity matrix, the m×m $H_2$ submatrix being a fixed precoder, and the $H_3$ submatrix being a 2m×2m version of the m×m $H_2$ submatrix; and
        cardinality of the candidate check nodes from $c_i \in \overline{N}_{s_j}^l \cap N_{proto,s_j}^k$ for depth l for the set of the variable nodes $s_j$ in the parity check matrix.

2. The apparatus according to claim 1, wherein the parity check matrix is configured with tail biting.

3. The apparatus according to claim 2, wherein the PEG expansion factor, the ACE expansion factor, and the input block length are selected from a group consisting of:
    the PEG expansion factor equal to 32, the ACE expansion factor equal to 64, and the input block length equal to 4096;
    the PEG expansion factor equal to 48, the ACE expansion factor equal to 64, and the input block length equal to 6144;
    the PEG expansion factor equal to 64, the ACE expansion factor equal to 64, and the input block length equal to 8192;
    the PEG expansion factor equal to 20, the ACE expansion factor equal to 100, and the input block length equal to 4000;
    the PEG expansion factor equal to 31, the ACE expansion factor equal to 100, and the input block length equal to 6200;
    the PEG expansion factor equal to 41, the ACE expansion factor equal to 100, and the input block length equal to 8200;
    the PEG expansion factor equal to 16, the ACE expansion factor equal to 128, and the input block length equal to 4096;
    the PEG expansion factor equal to 24, the ACE expansion factor equal to 128, and the input block length equal to 6144; and
    the PEG expansion factor equal to 32, the ACE expansion factor equal to 128, and the input block length equal to 8192.

4. The apparatus according to claim 1, wherein the parity check matrix is configured without tail biting.

5. The apparatus according to claim 4, wherein the PEG expansion factor, the ACE expansion factor, and the input block length are selected from a group consisting of:
    the PEG expansion factor equal to 32, the ACE expansion factor equal to 64, and the input block length equal to 4096;
    the PEG expansion factor equal to 48, the ACE expansion factor equal to 64, and the input block length equal to 6144;
    the PEG expansion factor equal to 64, the ACE expansion factor equal to 64, and the input block length equal to 8192;
    the PEG expansion factor equal to 20, the ACE expansion factor equal to 100, and the input block length equal to 4000;
    the PEG expansion factor equal to 31, the ACE expansion factor equal to 100, and the input block length equal to 6200;
    the PEG expansion factor equal to 41, the ACE expansion factor equal to 100, and the input block length equal to 8200;
    the PEG expansion factor equal to 16, the ACE expansion factor equal to 128, and the input block length equal to 4096;
    the PEG expansion factor equal to 24, the ACE expansion factor equal to 128, and the input block length equal to 6144; and
    the PEG expansion factor equal to 32, the ACE expansion factor equal to 128, and the input block length equal to 8192.

6. The apparatus according to claim 1, wherein the H matrix comprises:
   a first column and a second column associated with input bits;
   a third column associated with puncture bits; and
   a fourth column and a fifth column associated with accumulated bits.

7. The apparatus according to claim 1, wherein the at least one coder block is selected from a group consisting of an encoder and a decoder.

8. The apparatus according to claim 7, wherein the parity check matrix comprises circulant submatrices associated with check nodes and variable nodes.

9. The apparatus according to claim 8, wherein:
   a portion of the variable nodes are punctured variable nodes;
   a first portion of the circulant submatrices are all-zero submatrices; and
   a second portion of the circulant submatrices are shifted identity matrices.

10. The apparatus according to claim 9, wherein the parity check matrix has a structure associated with a scaled matrix representation of the protograph of an ARA encoder.

11. The apparatus according to claim 9, wherein the decoder is configured for message passing from and to the variable nodes and the check nodes excluding the punctured variable nodes.

12. The apparatus according to claim 11, wherein the punctured variable nodes are all set to zero.

13. A method, comprising:
   obtaining an H matrix by a coder;
   expanding the H matrix by the coder to provide a parity check matrix;
   wherein the expanding comprises:
      replacing each element of the H matrix with an m×m submatrix therefor to provide an expanded H matrix for m a positive integer expansion factor;
      Progressive Edge Growth ("PEG") expanding the expanded H matrix to provide a PEG expanded matrix; and
      Approximate Cycle Extrinsic Message Degree ("ACE") expanding the PEG expanded matrix to provide the parity check matrix; and
   outputting information by the coder using the parity check matrix;
   wherein the parity check matrix is for an accumulate-repeat-accumulate ("ARA") code;
   wherein the PEG expanding comprises:
      for each of variable nodes $s_j$, defining j from m to 3m−1;
      for different values of j, providing different starting values for connectivity k and different degrees for each of the variable nodes;
      choosing candidate check nodes from $c_i \in N_{proto,s_j}^0$ for set N of a protograph, wherein the protograph represented by the H matrix includes an m×m $H_1$ submatrix, an m×m $H_2$ submatrix, and $H_3$ submatrix each of which is a fixed matrix, the m×m $H_1$ submatrix being an identity matrix, the m×m submatrix being a fixed precoder, and the $H_3$ submatrix being a 2m×2m version of the m×m $H_2$ submatrix; and
      choosing cardinality of the candidate check nodes from $c_i \in \overline{N}_{s_j}^l \cap N_{proto,s_j}^k$ for depth l for the set of the variable nodes $s_j$ in the parity check matrix.

14. The method according to claim 13, wherein:
   a first two columns of the H matrix are populated with input bits;
   a middle column of the H matrix is populated with punctured bits; and
   a last two columns of the H matrix is populated with accumulated bits.

15. The method according to claim 13, wherein the replacing comprises:
   replacing each non-zero element of the H matrix with the m×m submatrix therefor having as many logic 1s in each column and each row of the m×m submatrix as a number of the non-zero element; and
   replacing each zero element of the H matrix with the m×m submatrix having all logic 0s;
   wherein the m×m $H_1$ submatrix, the m×m $H_2$ submatrix, and the 2m×2m $H_3$ submatrix are provided.

16. The method according to claim 13, wherein the replacing comprises:
   replacing each non-zero element of the H matrix with the m×m submatrix having as many logic 1s in each column and each row of the m×m submatrix as a number of the non-zero element, except for a single column and a single row of the m×m submatrix; and
   replacing each zero element of the H matrix with the m×m submatrix having all logic 0s;
   wherein the m×m $H_1$ submatrix, the m×m $H_2$ submatrix, and the 2m×2m $H_3$ submatrix are provided.

17. The method according to claim 13, wherein the m×m submatrix is an m×m random circulant matrix for providing the m×m $H_1$ submatrix the m×m $H_2$ submatrix, and the 2m×2m $H_3$ submatrix.

18. The method according to claim 13, further comprising:
   providing the parity check matrix having variable nodes and check nodes in a Tanner Graph representation thereof;
   wherein the variable nodes comprise punctured variable nodes and information variable nodes;
   passing a first portion of the information variable nodes for transmission;
   encoding the punctured variable nodes to provide encoded punctured variables; and
   encoding a second portion of the information variable nodes using the encoded punctured variables to provide encoded information variable nodes for transmission.

19. The method according to claim 13, further comprising:
   providing the parity check matrix having variable nodes and check nodes in a Tanner Graph representation thereof;
   wherein the variable nodes comprise punctured variable nodes and decision variable nodes;
   setting each of the punctured variable nodes to zero;
   initializing first messages for the variable nodes;
   receiving the first messages to the check nodes;
   generating second messages for the check nodes; and
   determining elements in a codeword.

* * * * *